(12) United States Patent
Gamei et al.

(10) Patent No.: US 11,671,599 B2
(45) Date of Patent: Jun. 6, 2023

(54) DATA ENCODING AND DECODING

(71) Applicant: Sony Group Corporation, Tokyo (JP)

(72) Inventors: James Alexander Gamei, Surrey (GB); Karl James Sharman, Newbury (GB)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/695,114

(22) Filed: Mar. 15, 2022

(65) Prior Publication Data

US 2022/0217351 A1 Jul. 7, 2022

Related U.S. Application Data

(63) Continuation of application No. 14/778,394, filed as application No. PCT/GB2014/051066 on Apr. 4, 2014, now Pat. No. 11,290,720.

(30) Foreign Application Priority Data

Apr. 8, 2013 (GB) ..................... 1306334

(51) Int. Cl.
*H04N 19/13* (2014.01)
*H03M 7/40* (2006.01)
(Continued)

(52) U.S. Cl.
CPC .......... *H04N 19/13* (2014.11); *H03M 7/4018* (2013.01); *H04N 19/107* (2014.11);
(Continued)

(58) Field of Classification Search
CPC .... H04N 19/13; H04N 19/625; H04N 19/129; H04N 19/159; H04N 19/52; H04N 19/61; H03M 7/4018
See application file for complete search history.

(56) References Cited

U.S. PATENT DOCUMENTS

| 2003/0103573 A1 | 6/2003 | Woo |
| 2004/0056787 A1 | 3/2004 | Bossen |

(Continued)

FOREIGN PATENT DOCUMENTS

| CN | 1198613 A | 11/1998 |
| CN | 1418014 A | 5/2003 |

(Continued)

OTHER PUBLICATIONS

Yuan-Hsin Liao et al., "A Highly Efficient VLSI Architecture for H.264/AVC Level 5.1 CABAC Decoder", IEEE Transactions on Circuits and Systems for Video Technology, No. 2, Jun. 27, 2011, 272-281.

(Continued)

*Primary Examiner* — On S Mung
(74) *Attorney, Agent, or Firm* — Oblon, McClelland, Maier & Neustadt, L.L.P.

(57) ABSTRACT

A method of data encoding input data values of a data set for encoding includes selecting one of a plurality of complementary sub-ranges of a set of code values according to the value of a current input data value, the set of code values being defined by a range variable, assigning the current input data value to a code value within the selected sub-range, modifying the set of code values in dependence upon the assigned code value and the size of the selected sub-range, detecting whether the range variable defining the set of code values is less than a predetermined minimum size and if so, successively increasing the range variable so as to increase the size of the set of code values until it has at least the predetermined minimum size and outputting an encoded data bit in response to each such size-increasing operation, and after encoding a group of input data values, setting the range variable to a value selected from a predetermined (Continued)

subset of available range variable values, each value in the subset having at least one least significant bit equal to zero.

20 Claims, 19 Drawing Sheets

(51) Int. Cl.
*H04N 19/91* (2014.01)
*H04N 19/107* (2014.01)
*H04N 19/117* (2014.01)
*H04N 19/129* (2014.01)
*H04N 19/159* (2014.01)
*H04N 19/52* (2014.01)
*H04N 19/593* (2014.01)
*H04N 19/61* (2014.01)
*H04N 19/625* (2014.01)

(52) U.S. Cl.
CPC ......... *H04N 19/117* (2014.11); *H04N 19/129* (2014.11); *H04N 19/159* (2014.11); *H04N 19/52* (2014.11); *H04N 19/593* (2014.11); *H04N 19/61* (2014.11); *H04N 19/625* (2014.11); *H04N 19/91* (2014.11)

(56) References Cited

U.S. PATENT DOCUMENTS

| | | |
|---|---|---|
| 2005/0156762 A1 | 7/2005 | Tsuru |
| 2007/0040711 A1 | 2/2007 | Ziauddin |
| 2007/0171985 A1 | 7/2007 | Kim |
| 2008/0048893 A1 | 2/2008 | Xu |
| 2009/0219183 A1 | 9/2009 | Sakaguchi |
| 2010/0329334 A1 | 12/2010 | Kim |
| 2011/0285557 A1 | 11/2011 | Korodi |
| 2013/0027230 A1 | 1/2013 | Marpe |
| 2013/0028334 A1 | 1/2013 | Bossen |
| 2014/0286417 A1 | 9/2014 | Gamei et al. |
| 2014/0307807 A1 | 10/2014 | Gamei et al. |
| 2015/0043641 A1 | 2/2015 | Gamei et al. |
| 2015/0063457 A1 | 3/2015 | Gamei et al. |
| 2015/0063460 A1 | 3/2015 | Gamei et al. |
| 2015/0078447 A1 | 3/2015 | Gamei et al. |
| 2015/0085924 A1 | 3/2015 | Gamei et al. |
| 2015/0117527 A1 | 4/2015 | Gamei et al. |
| 2015/0172652 A1 | 6/2015 | Gamei et al. |

FOREIGN PATENT DOCUMENTS

| | | |
|---|---|---|
| CN | 1642287 A | 7/2005 |
| CN | 101076114 A | 11/2007 |
| CN | 102231830 A | 11/2011 |
| CN | 102939755 A | 2/2013 |
| GB | 2496201 A | 5/2013 |
| GB | 2496210 A | 5/2013 |
| WO | WO-2004028165 A2 | 4/2004 |

OTHER PUBLICATIONS

Liu Wei et al., "Video coding techniques for networks", Journal on Communications, vol. 26 No.9, Sep. 30, 2005, 85-92.

Wang Juan, Research on the Structure of Remote Sensing Image Compression Encoder, and Realization of Important Circuit Modules, Chinese Master's Theses Full-text Database Information Technology Edition, Mar. 15, 2013, I140-653.

International Search Report dated Jun. 23, 2014, in PCT/GB2014/051066 filed Apr. 4, 2014.

K. Sharman et al., "CABAC Stream Termination", Joint Collaborative Team On Video Coding (JCT-VC) of ITU-T SG16 WP3 and ISO/IEC JTC1/SC29/WG11, 7th Meeting, (Nov. 21-30, 2011), 4 Pages, XP030110477.

D. Marpe et al., "Context-Based Adaptive Binary Arithmetic Coding in the H.264/AVC Video Compression Standard", IEEE Transactions on Circuits and Systems for Video Technology, vol. 13, No. 7, (Jul. 2003), pp. 620-636, XP011099255.

Anonymous, "Arithmetic Coding", Wikipedia, http://en.wikipedia.org/wiki/Arithmetic coding, (Feb. 17, 2013), pp. 1-14, XP055120838.

B. Bross et al., "High Efficiency Video Coding (HEVC) text specification draft 10 (for FDIS & Consent)", Joint Collaborative Team on Video Coding (JCT-VC) of ITU-T SG 16 WP 3 and ISO/IEC JTC 1/SC 291WG 11, 12th Meeting, (Jan. 14-23, 2013), 332 Pages, XP030056638.

B. Bross et al., "WD4; Working Draft 4 of High-Efficiency Video Coding", Joint Collaborative Team on Video Coding (JCT-VC), of ITU-T SG16 WP3 and ISO/IEC JTC1/SC29/WG11, 6th Meeting. (Jul 14-22, 2011), XP030009800.

Decision to Grant a Patent dated Dec. 20, 2016 in Japanese Application No. 2016-507051 (w/ English Translation), (4 pages).

K. Sharman, et al.; AHG5: Range Extensions and High Bit Depths, Joint Collaborative Team on Video Coding (JCT-VC) of ITU-T SG 16 WP 3 and IS O/IEC JTC 1SC 29/WG 11,13[th] Meeting: Incheon, KR, Apr. 18-26, 2013, JCTVC-MO178, U R L; HTTP://phenix.It-sudpans.eu/jct/doc_end_user/documents/13_Incheon/wg11/JCTVC-MO178-v1.zip.

David Flynn et al., *Overview of the Range Extensions for the HEVC, Standard Tools, Profiles, and Performance*, IEEE Transactions on Circuits and Systems for Video Technology, vol. 26, No. 1, Jan. 2016 (16 pages).

Combined Chinese Office Action and Search Report dated Aug. 2, 2017 in Patent Application No. 201480020288.7 (English Translation only).

Yu Poisong et al., "Application Research of CABAC in the H.264/AVC Standard", Modern Electronics Technique, 2005, (with English Translation), 7 pages.

0 = Planar
1 = DC

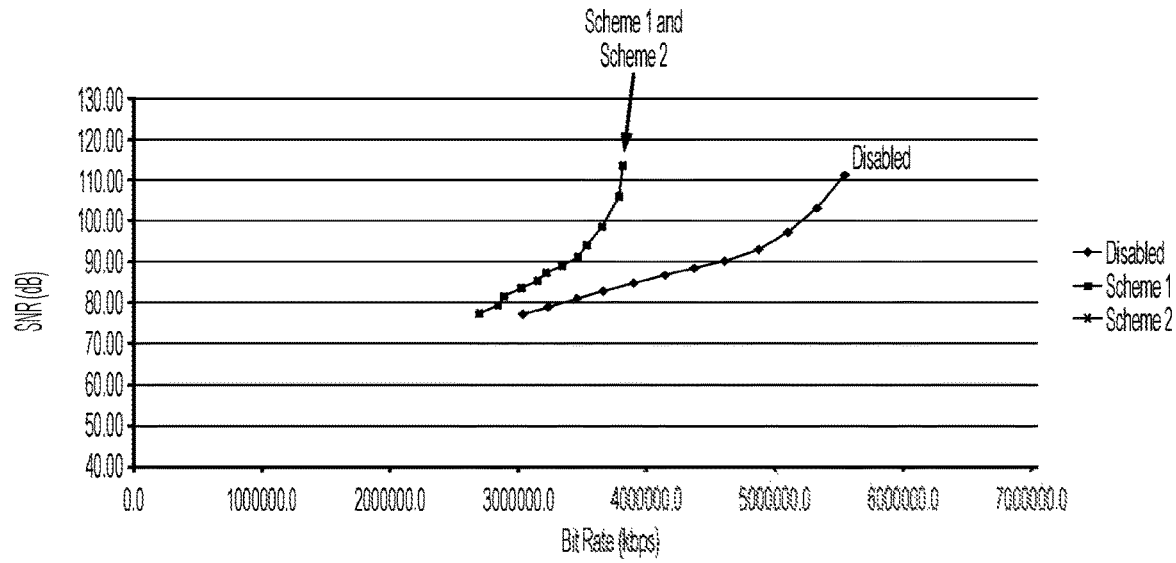

FIG. 27

| Profile | Chroma Formats | | | | Maximum bitDepth | Prediction | | Transform Matrix Precision | MAX_TR_DYNAMIC_RANGE | ENTROPY_CODING_DYNAMIC_RANGE | CABAC Fixed Bits and Bit Alignment | Profiles Also Supported |
|---|---|---|---|---|---|---|---|---|---|---|---|---|
| | 4:0:0 | 4:2:0 | 4:2:2 | 4:4:4 | | Intra | Inter | | | | | |
| Main* | X | ✓ | X | X | 8 | ✓ | ✓ | 6 | 15 | 15 | X | None |
| Main 10* | X | ✓ | X | X | 10 | ✓ | ✓ | 6 | 15 | 15 | X | Main |
| Main 10 4:0:0 | ✓ | X | X | X | 10 | ✓ | ✓ | 6 | 15 | 15 | X | None |
| Main 10 4:2:2 | ✓ | ✓ | ✓ | X | 10 | ✓ | ✓ | 6 | 15 | 15 | X | Main 10, Main 10 4:0:0 |
| Main 10 4:4:4 | ✓ | ✓ | ✓ | ✓ | 10 | ✓ | ✓ | 6 | 15 | 15 | X | Main 10 4:2:2 |
| Extended 4:2:2 | ✓ | ✓ | ✓ | X | 12 | ✓ | ✓ | 10 | 17 | 18 | ✓ | Main 10 4:2:2 |
| Extended 4:4:4 | ✓ | ✓ | ✓ | ✓ | 12 | ✓ | ✓ | 10 | 17 | 18 | ✓ | Extended 4:2:2, Main 10 4:4:4 |
| High Intra 4:0:0 | ✓ | X | X | X | 16 | ✓ | X | 14 | 21 | 22 | ✓ | None |
| High Intra 4:4:4 | ✓ | ✓ | ✓ | ✓ | 16 | ✓ | X | 14 | 21 | 22 | ✓ | High Intra 4:0:0 |
| High 4:0:0 | ✓ | X | X | X | 16 | ✓ | ✓ | 14 | 21 | 22 | ✓ | Main 10 4:0:0, High Intra 4:0:0 |
| High 4:4:4 | ✓ | ✓ | ✓ | ✓ | 16 | ✓ | ✓ | 14 | 21 | 22 | ✓ | Extended 4:4:4, High Intra 4:4:4 |

FIG. 28

DATA ENCODING AND DECODING

INCORPORATION BY REFERENCE

This is a continuation application of U.S. application Ser. No. 14/778,394, filed Sep. 18, 2015, which is a National Stage of International Application No. PCT/GB2014/51066, filed Apr. 4, 2014, which claims the benefit of Great Britain Patent Application No. 1306334.2 filed Apr. 8, 2013, the entire contents of each of which are incorporated herein by reference.

FIELD OF THE INVENTION

This disclosure relates to data encoding and decoding.

DESCRIPTION OF THE RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

There are several video data compression and decompression systems which involve transforming video data into a frequency domain representation, quantising the frequency domain coefficients and then applying some form of entropy encoding to the quantised coefficients.

Entropy, in the present context, can be considered as representing the information content of a data symbol or series of symbols. The aim of entropy encoding is to encode a series of data symbols in a lossless manner using (ideally) the smallest number of encoded data bits which are necessary to represent the information content of that series of data symbols. In practice, entropy encoding is used to encode the quantised coefficients such that the encoded data is smaller (in terms of its number of bits) than the data size of the original quantised coefficients. A more efficient entropy encoding process gives a smaller output data size for the same input data size.

One technique for entropy encoding video data is the so-called CABAC (context adaptive binary arithmetic coding) technique.

SUMMARY

This disclosure provides a data encoding method according to claim 1.

Further respective aspects and features are defined in the appended claims.

It is to be understood that both the foregoing general description and the following detailed description are exemplary, but not restrictive of, the present disclosure.

BRIEF DESCRIPTION OF THE DRAWINGS

A more complete appreciation of the disclosure and many of the attendant advantages thereof will be readily obtained as the same becomes better understood by reference to the following detailed description of embodiments, when considered in connection with the accompanying drawings, wherein:

FIG. 27 is a graph of PSNR against bit rate for one test sequence showing the use of bypass fixed-bit encoding;

FIG. 28 is a table providing examples of encoding profiles;

DESCRIPTION OF THE EMBODIMENTS

Figure 1:
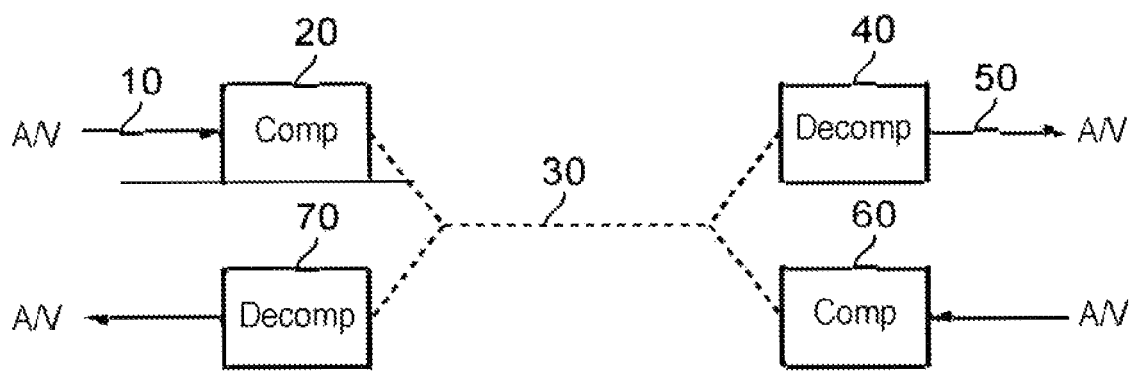
FIG. 1 schematically illustrates an audio/video (A/V) data transmission and reception system using video data compression and decompression.

Referring now to the drawings, FIGS. 1-4 are provided to give schematic illustrations of apparatus or systems making use of the compression and/or decompression apparatus to be described below in connection with embodiments.

All of the data compression and/or decompression apparatus is to be described below may be implemented in hardware, in software running on a general-purpose data processing apparatus such as a general-purpose computer, as programmable hardware such as an application specific integrated circuit (ASIC) or field programmable gate array (FPGA) or as combinations of these, in cases where the embodiments are implemented by software and/or firmware, it will be appreciated that such software and/or firmware, and non-transitory machine-readable data storage media by which such software and/or firmware are stored or otherwise provided, are considered as embodiments.

FIG. 1 schematically illustrates an audio/video data transmission and reception system using video data compression and decompression.

An input audio/video signal 10 is supplied to a video data compression apparatus 20 which compresses at least the video component of the audio/video signal 10 for transmission along a transmission route 30 such as a cable, an optical fibre, a wireless link or the like. The compressed signal is processed by a decompression apparatus 40 to provide an output audio/video signal 50. For the return path, a compression apparatus 60 compresses an audio/video signal for transmission along the transmission route 30 to a decompression apparatus 70.

The compression apparatus 20 and decompression apparatus 70 can therefore form one node of a transmission link. The decompression apparatus 40 and compression apparatus 60 can form another node of the transmission link. Of course, in instances where the transmission link is uni-directional, only one of the nodes would require a compression apparatus and the other node would only require a decompression apparatus.

Figure 2:
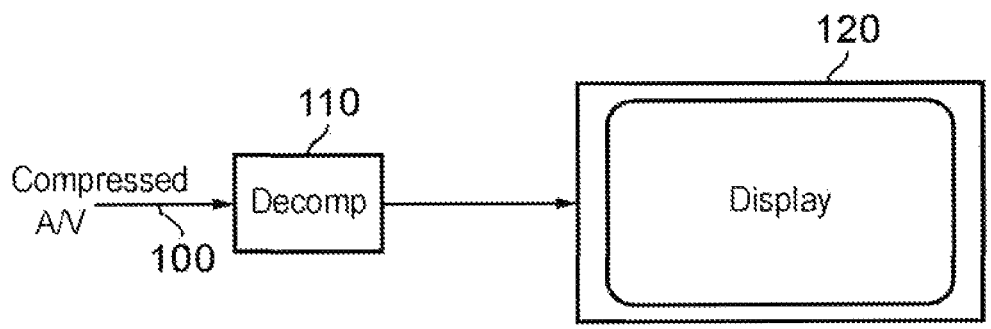
FIG. 2 schematically illustrates a video display system using video data decompression.

FIG. 2 schematically illustrates a video display system using video data decompression. In particular, a compressed audio/video signal 100 is processed by a decompression apparatus 110 to provide a decompressed signal which can be displayed on a display 120. The decompression apparatus 110 could be implemented as an integral part of the display 120, for example being provided within the same casing as the display device. Alternatively, the decompression apparatus 110 might be provided as (for example) a so-called set top box (STB), noting that the expression "set-top" does not imply a requirement for the box to be sited in any particular orientation or position with respect to the display 120; it is simply a term used in the art to indicate a device which is connectable to a display as a peripheral device.

Figure 3:
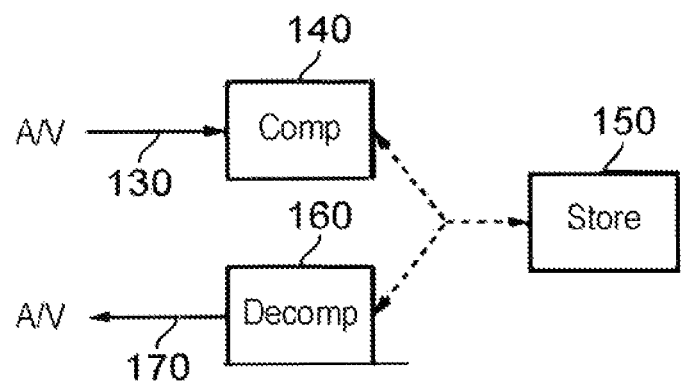
FIG. 3 schematically illustrates an audio/video storage system using video data compression and decompression.

FIG. 3 schematically illustrates an audio/video storage system using video data compression and decompression. An input audio/video signal 130 is supplied to a compression apparatus 140 which generates a compressed signal for storing by a store device 150 such as a magnetic disk device, an optical disk device, a magnetic tape device, a solid state storage device such as a semiconductor memory or other storage device. For replay, compressed data is read from the store device 150 and passed to a decompression apparatus 160 for decompression to provide an output audio/video signal 170.

It will be appreciated that the compressed or encoded signal, and a storage medium or data carrier storing that signal, are considered as embodiments.

Figure 4:
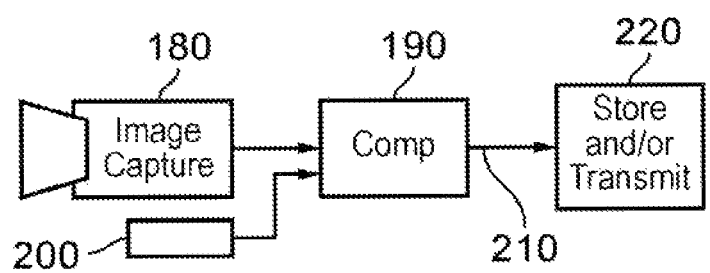
FIG. 4 schematically illustrates a video camera using video data compression.

FIG. 4 schematically illustrates a video camera using video data compression. In FIG. 4, and image capture device 180, such as a charge coupled device (CCD) image sensor and associated control and read-out electronics, generates a video signal which is passed to a compression apparatus 190. A microphone (or plural microphones) 200 generates an audio signal to be passed to the compression apparatus 190. The compression apparatus 190 generates a compressed audio/video signal 210 to be stored and/or transmitted (shown generically as a schematic stage 220).

The techniques to be described below relate primarily to video data compression. It will be appreciated that many existing techniques may be used for audio data compression in conjunction with the video data compression techniques which will be described, to generate a compressed audio/video signal. Accordingly, a separate discussion of audio data compression will not be provided. It will also be appreciated that the data rate associated with video data, in particular broadcast quality video data, is generally very much higher than the data rate associated with audio data (whether compressed or uncompressed). It will therefore be appreciated that uncompressed audio data could accompany compressed video data to form a compressed audio/video signal. It will further be appreciated that although the present examples (shown in FIGS. 1-4) relate to audio/video data, the techniques to be described below can find use in a system which simply deals with (that is to say, compresses, decompresses, stores, displays and or transmits) video data. That is to say, the embodiments can apply to video data compression without necessarily having any associated audio data handling at all.

Figure 5:
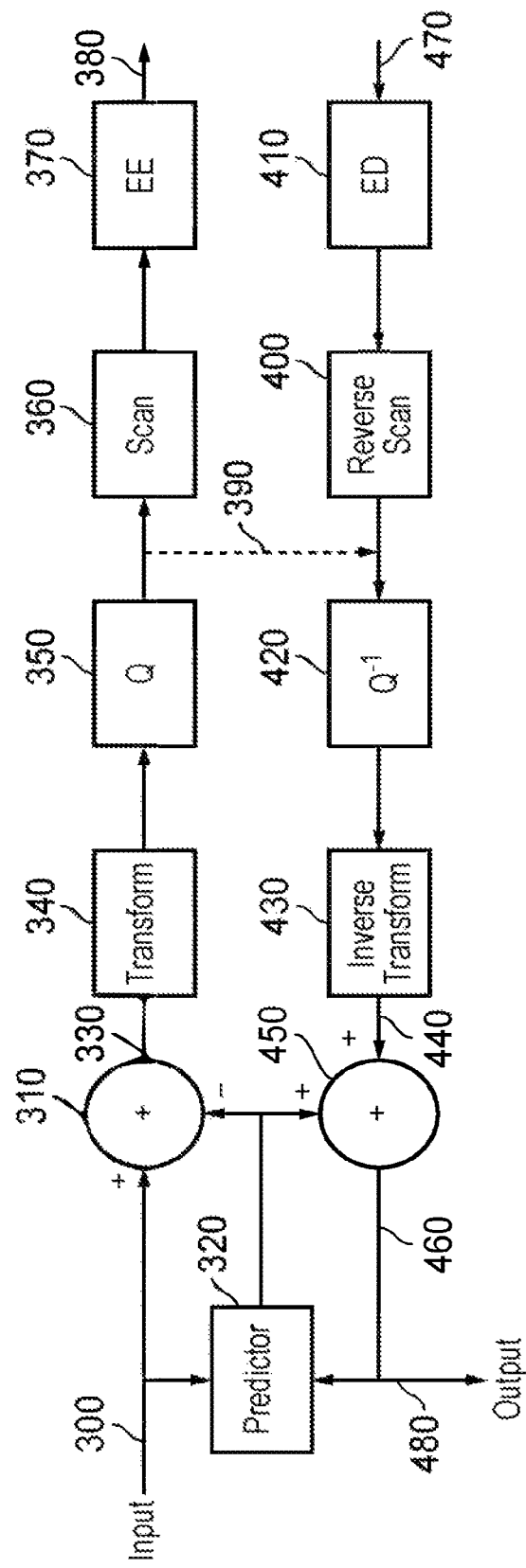
FIG. 5 provides a schematic overview of a video data compression and decompression apparatus.

FIG. 5 provides a schematic overview of a video data compression and decompression apparatus.

Successive images of an input video signal 300 are supplied to an adder 310 and to an image predictor 320. The image predictor 320 will be described below in more detail with reference to FIG. 6. The adder 310 in fact performs a subtraction (negative addition) operation, in that it receives the input video signal 300 on a "+" input and the output of the image predictor 320 on a "−" input, so that the predicted image is subtracted from the input image. The result is to generate a so-called residual image signal 330 representing the difference between the actual and projected images.

One reason why a residual image signal is generated is as follows. The data coding techniques to be described, that is to say the techniques which will be applied to the residual image signal, tends to work more efficiently when there is less "energy" in the image to be encoded. Here, the term "efficiently" refers to the generation of a small amount of encoded data; for a particular image quality level, it is desirable (and considered "efficient") to generate as little data as is practicably possible. The reference to "energy" in the residual image relates to the amount of information contained in the residual image. If the predicted image were to be identical to the real image, the difference between the two (that is to say, the residual image) would contain zero information (zero energy) and would be very easy to encode into a small amount of encoded data. In general, if the prediction process can be made to work reasonably well, the expectation is that the residual image data will contain less information (less energy) than the input image and so will be easier to encode into a small amount of encoded data.

The residual image data 330 is supplied to a transform unit 340 which generates a discrete cosine transform (DCT) representation of the residual image data. The DCT technique itself is well known and will not be described in detail here. There are however aspects of the techniques used in the present apparatus which will be described in more detail below, in particular relating to the selection of different blocks of data to which the DCT operation is applied. These will be discussed with reference to FIGS. 7-12 below.

Note that in some embodiments, a discrete sine transform (DST) is used instead of a DCT. In other embodiments, no transform might be used. This can be done selectively, so that the transform stage is, in effect, bypassed, for example under the control of a "transform skip" command or mode.

The output of the transform unit 340, which is to say, a set of transform coefficients for each transformed block of image data, is supplied to a quantiser 350. Various quantisation techniques are known in the field of video data compression, ranging from a simple multiplication by a quantisation scaling factor through to the application of complicated lookup tables under the control of a quantisation parameter. The general aim is twofold. Firstly, the quantisation process reduces the number of possible values of the transformed data. Secondly, the quantisation process can increase the likelihood that values of the transformed data are zero. Both of these can make the entropy encoding process, to be described below, work more efficiently in generating small amounts of compressed video data.

A data scanning process is applied by a scan unit 360. The purpose of the scanning process is to reorder the quantised transformed data so as to gather as many as possible of the non-zero quantised transformed coefficients together, and of course therefore to gather as many as possible of the zero-valued coefficients together. These features can allow so-called run-length coding or similar techniques to be applied efficiently. So, the scanning process involves selecting coefficients from the quantised transformed data, and in particular from a block of coefficients corresponding to a block of image data which has been transformed and quantised, according to a "scanning order" so that (a) all of the coefficients are selected once as part of the scan, and (b) the scan tends to provide the desired reordering. Techniques for selecting a scanning order will be described below. One example scanning order which can tend to give useful results is a so-called zigzag scanning order.

The scanned coefficients are then passed to an entropy encoder (EE) 370. Again, various types of entropy encoding may be used. Two examples which will be described below are variants of the so-called CABAC (Context Adaptive Binary Arithmetic Coding) system and variants of the so-called CAVLC (Context Adaptive Variable-Length Coding) system. In general terms, CABAC is considered to provide a better efficiency, and in some studies has been shown to provide a 10-20% reduction in the quantity of encoded output data for a comparable image quality compared to CAVLC. However, CAVLC is considered to represent a much lower level of complexity (in terms of its implementation) than CABAC. The CABAC technique will be discussed with reference to FIG. 17 below, and the CAVLC technique will be discussed with reference to FIGS. 18 and 19 below.

Note that the scanning process and the entropy encoding process are shown as separate processes, but in fact can be combined or treated together. That into say, the reading of data into the entropy encoder can take place in the scan order. Corresponding considerations apply to the respective inverse processes to be described below.

The output of the entropy encoder 370, along with additional data (mentioned above and/or discussed below), for example defining the manner in which the predictor 320 generated the predicted image, provides a compressed output video signal 380.

However, a return path is also provided because the operation of the predictor 320 itself depends upon a decompressed version of the compressed output data.

The reason for this feature is as follows. At the appropriate stage in the decompression process (to be described below) a decompressed version of the residual data is generated. This decompressed residual data has to be added to a predicted image to generate an output image (because the original residual data was the difference between the input image and a predicted image). In order that this process is comparable, as between the compression side and the decompression side, the predicted images generated by the predictor 320 should be the same during the compression process and during the decompression process. Of course, at decompression, the apparatus does not have access to the original input images, but only to the decompressed images. Therefore, at compression, the predictor 320 bases its prediction (at least, for inter-image encoding) on decompressed versions of the compressed images.

The entropy encoding process carried out by the entropy encoder 370 is considered to be "lossless", which is to say that it can be reversed to arrive at exactly the same data which was first supplied to the entropy encoder 370. So, the return path can be implemented before the entropy encoding stage. Indeed, the scanning process carried out by the scan unit 360 is also considered lossless, but in the present embodiment the return path 390 is from the output of the quantiser 350 to the input of a complimentary inverse quantiser 420.

In general terms, an entropy decoder 410, the reverse scan unit 400, an inverse quantiser 420 and an inverse transform unit 430 provide the respective inverse functions of the entropy encoder 370, the scan unit 360, the quantiser 350 and the transform unit 340. For now, the discussion will continue through the compression process, the process to decompress an input compressed video signal will be discussed separately below.

In the compression process, the scanned coefficients are passed by the return path 390 from the quantiser 350 to the inverse quantiser 420 which carries out the inverse operation of the scan unit 360. An inverse quantisation and inverse transformation process are carried out by the units 420, 430 to generate a compressed-decompressed residual image signal 440.

The image signal 440 is added, at an adder 450, to the output of the predictor 320 to generate a reconstructed output image 460. This forms one input to the image predictor 320, as will be described below.

Turning now to the process applied to a received compressed video signal 470, the signal is supplied to the entropy decoder 410 and from there to the chain of the reverse scan unit 400, the inverse quantiser 420 and, the inverse transform unit 430 before being added to the output of the image predictor 320 by the adder 450. In straightforward terms, the output 460 of the adder 450 forms the output decompressed video signal 450. In practice, further filtering may be applied before the signal is output.

Figure 6:
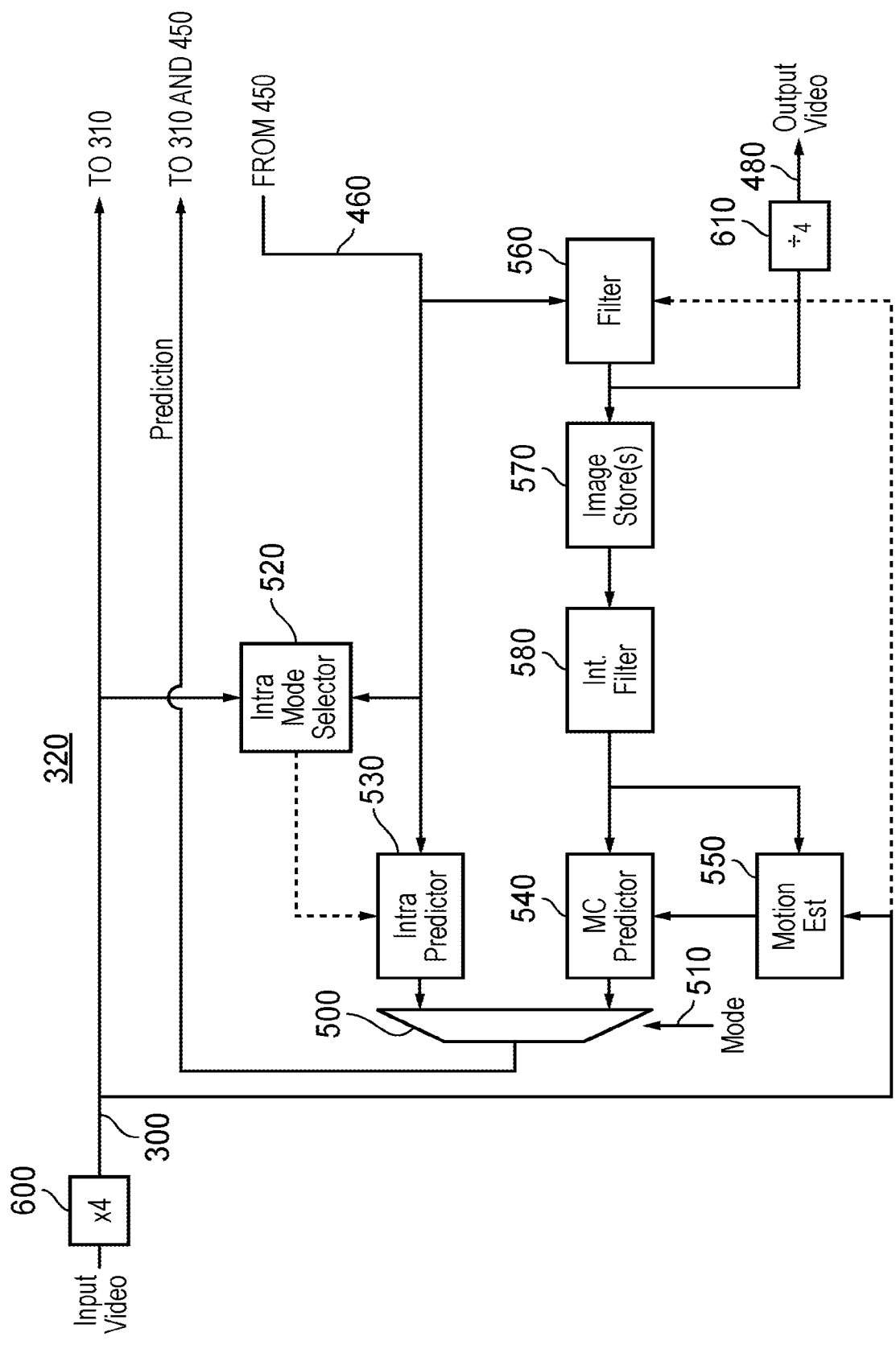
FIG. 6 schematically illustrates the generation of predicted images.
Figure 7:
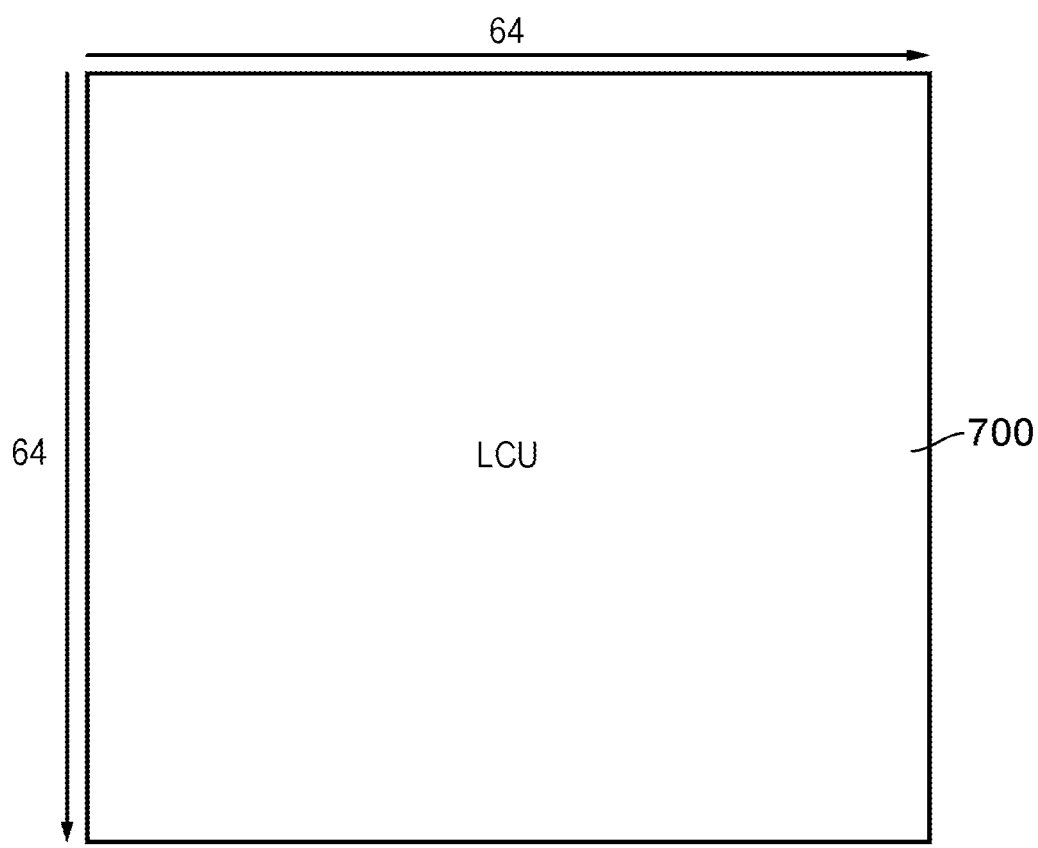
FIG. 7 schematically illustrates a largest coding unit (LCU)

FIG. 6 schematically illustrates the generation of predicted images, and in particular the operation of the image predictor 320.

There are two basic modes of prediction: so-called intra-image prediction and so-called inter-image, or motion-compensated (MC), prediction.

Intra-image prediction bases a prediction of the content of a block of the image on data from within the same image. This corresponds to so-called I-frame encoding in other video compression techniques, in contrast to I-frame encoding, where the whole image is intra-encoded, in the present embodiments the choice between intra- and inter-encoding can be made on a block-by-block basis, though in other embodiments the choice is still made on an image-by-image basis.

Motion-compensated prediction makes use of motion information which attempts to define the source, in another adjacent or nearby image, of image detail to be encoded in the current image. Accordingly, in an ideal example, the contents of a block of image data in the predicted image can be encoded very simply as a reference (a motion vector) pointing to a corresponding block at the same or a slightly different position in an adjacent image.

Returning to FIG. 6, two image prediction arrangements (corresponding to intra- and inter-image prediction) are shown, the results of which are selected by a multiplexer 500 under the control of a mode signal 510 so as to provide blocks of the predicted image for supply to the adders 310 and 450. The choice is made in dependence upon which selection gives the lowest "energy" (which, as discussed above, may be considered as information content requiring encoding), and the choice is signalled to the encoder within the encoded output datastream. Image energy, in this context, can be detected, for example, by carrying out a trial subtraction of an area of the two versions of the predicted image from the input image, squaring each pixel value of the difference image, summing the squared values, and identifying which of the two versions gives rise to the lower mean squared value of the difference image relating to that image area.

The actual prediction, in the intra-encoding system, is made on the basis of image blocks received as part of the signal 460, which is to say, the prediction is based upon encoded-decoded image blocks in order that exactly the same prediction can be made at a decompression apparatus. However, data can be derived from the input video signal 300 by an intra-mode selector 520 to control the operation of the intra-image predictor 530.

For inter-image prediction, a motion compensated (MC) predictor 540 uses motion information such as motion vectors derived by a motion estimator 550 from the input video signal 300. Those motion vectors are applied to a processed version of the reconstructed image 460 by the motion compensated predictor 540 to generate blocks of the inter-image prediction.

The processing applied to the signal 460 will now be described. Firstly, the signal is filtered by a filter unit 560. This involves applying a "deblocking" filter to remove or at least tend to reduce the effects of the block-based processing carried out by the transform unit 340 and subsequent operations. Also, an adaptive loop filter is applied using coefficients derived by processing the reconstructed signal 460 and the input video signal 300. The adaptive loop filter is a type of filter which, using known techniques, applies adaptive filter coefficients to the data to be filtered. That is to say, the filter coefficients can vary in dependence upon various factors. Data defining which filter coefficients to use is included as part of the encoded output datastream.

The filtered output from the filter unit 560 in fact forms the output video signal 480. It is also buffered in one or more image stores 570; the storage of successive images is a requirement, of motion compensated prediction processing, and in particular the generation of motion vectors. To save on storage requirements, the stored images in the image stores 570 may be held in a compressed form and then decompressed for use in generating motion vectors. For this particular purpose, any known compression/decompression system may be used. The stored images are passed to an interpolation filter 580 which generates a higher resolution version of the stored images; in this example, intermediate samples (sub-samples) are generated such that the resolution of the interpolated image is output by the interpolation filter 580 is 8 times (in each dimension) that of the images stored in the image stores 570. The interpolated images are passed as an input to the motion estimator 550 and also to the motion compensated predictor 540.

In embodiments, a further optional stage is provided, which is to multiply the data values of the input video signal by a factor of four using a multiplier 600 (effectively just shifting the data values left by two bits), and to apply a corresponding divide operation (shift right by two bits) at the output of the apparatus using a divider or right-shifter 610. So, the shifting left and shifting right changes the data purely for the internal operation of the apparatus. This measure can provide for higher calculation accuracy within the apparatus, as the effect of any data rounding errors is reduced.

The way in which an image is partitioned for compression processing will now be described. At a basic level, and image to be compressed is considered as an array of blocks of samples. For the purposes of the present discussion, the largest such block under consideration is a so-called largest coding unit (LCU) 700 (FIG. 7), which represents a square array of 64×64 samples. Here, the discussion relates to luminance samples. Depending on, the chrominance mode, such as 4:4:4, 4:2:2, 4:2:0 or 4:4:4:4 (GBR plus key data), there will be differing numbers of corresponding chrominance samples corresponding to the luminance block.

Three basic types of blocks will be described: coding units, prediction units and transform units. In general terms, the recursive subdividing of the LCUs allows an input picture to be partitioned in such a way that both the block sizes and the block coding parameters (such as prediction or residual coding modes) can be set according to the specific characteristics of the image to be encoded.

Figure 8:
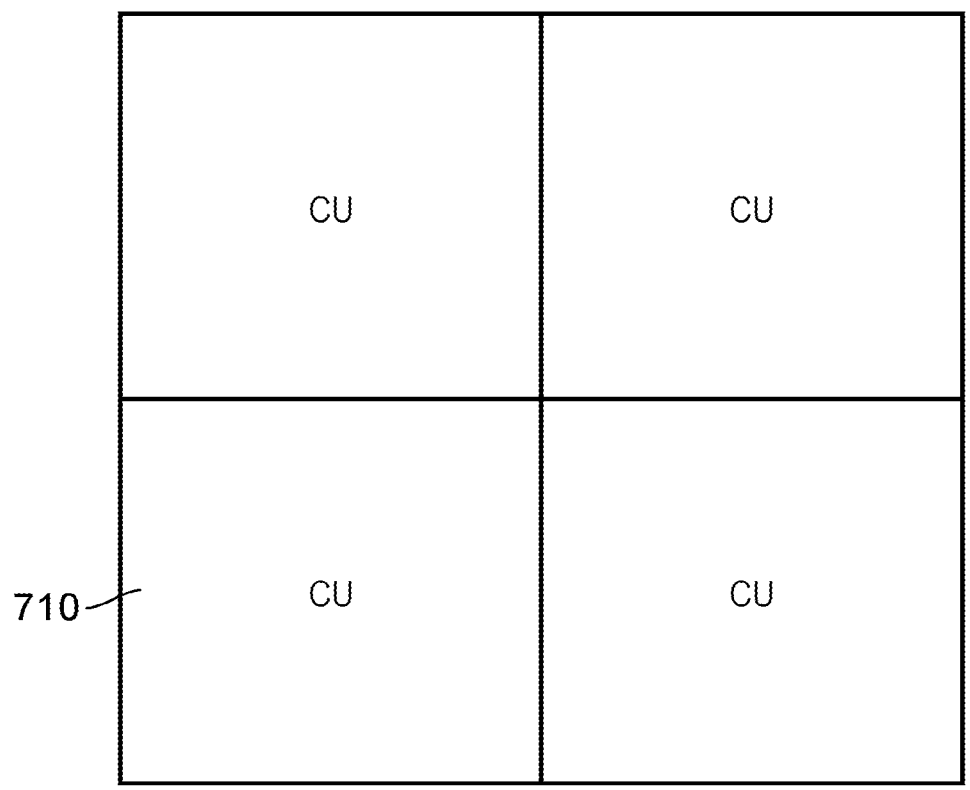
FIG. 8 schematically illustrates a set of four coding units (CU)
Figure 9:
FIGS. 9 and 10 schematically illustrate the coding units of FIG. 8 sub-divided into smaller coding units.
Figure 10:
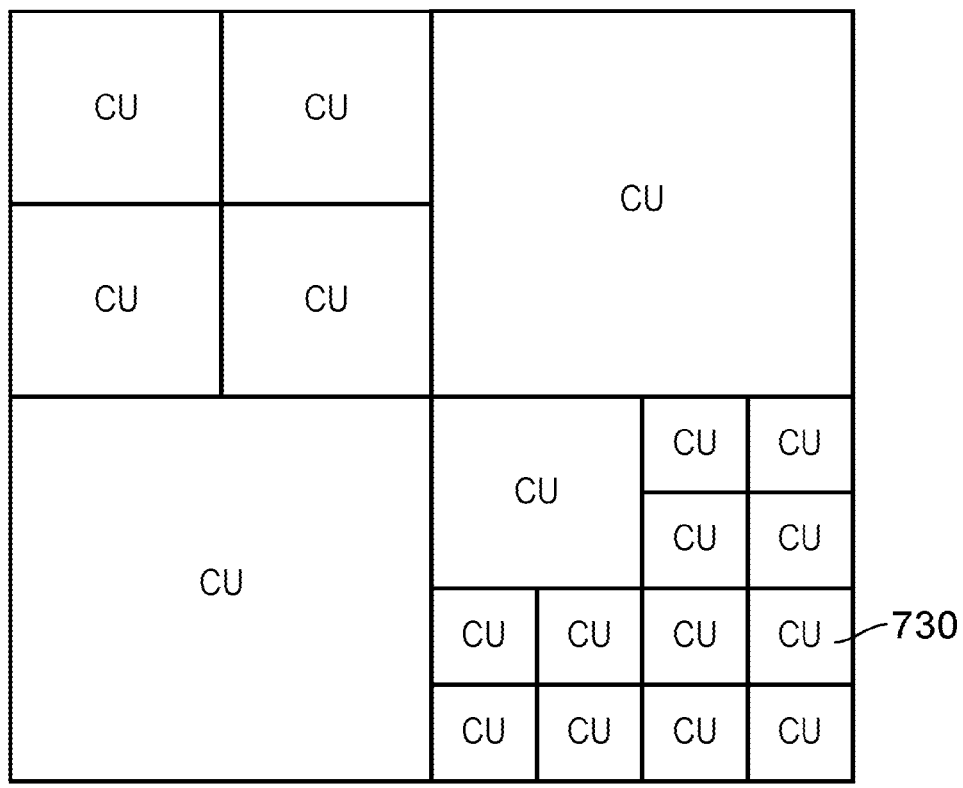

The LCU may be subdivided into so-called coding units (CU). Coding units are always square and have a size between 8×8 samples and the full size of the LCU 700. The coding units can be arranged as a kind of tree structure, so that a first subdivision may take place as shown in FIG. 8, giving coding, units 710 of 32×32 samples; subsequent subdivisions may then take place on a selective basis so as to give some coding units 720 of 16×16 samples (FIG. 9) and potentially some coding units 730 of 8×8 samples (FIG. 10). Overall, this process can provide a content-adapting coding tree structure of CU blocks, each of which may be as large as the LCU or as small as 8×8 samples. Encoding of the output video data takes place on the basis of the coding unit structure.

Figure 11:
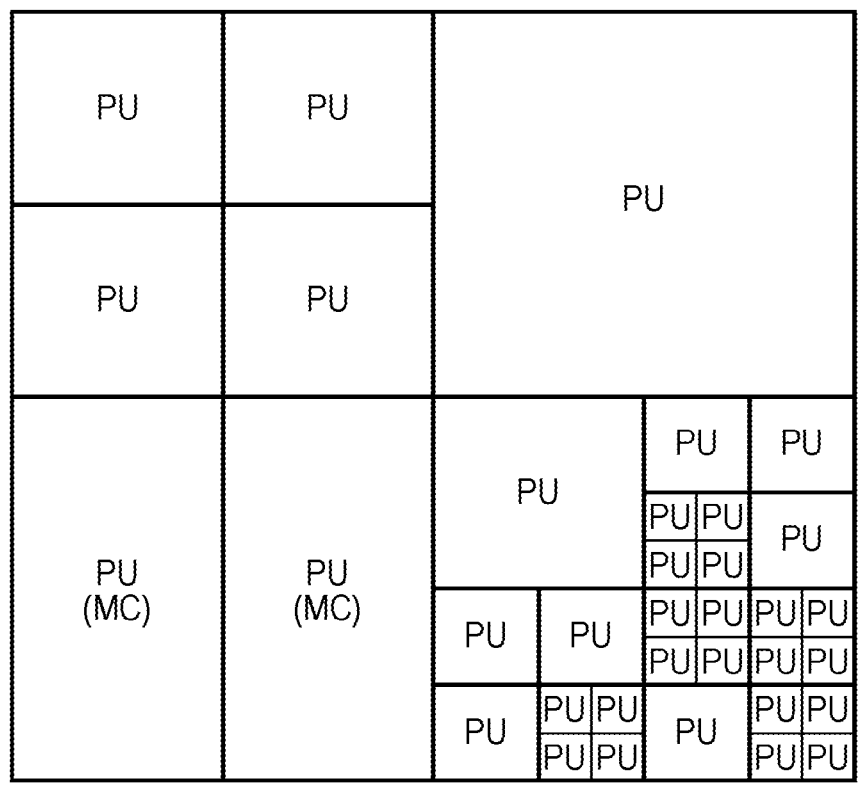
FIG. 11 schematically illustrates an array of prediction units (PU)

FIG. 11 schematically illustrates an array of prediction units (PU). A prediction unit is a basic unit for carrying information relating to the image prediction processes, or in other words the additional data added to the entropy encoded residual image data to form the output video signal from the apparatus of FIG. 5. In general, prediction units are not restricted to being square in shape. They can take other shapes, in particular rectangular shapes forming half of one of the square coding units, as long as the coding unit is greater than the minimum (8×8) size. The aim is to allow the boundary of adjacent prediction units to match (as closely as possible) the boundary of real objects in the picture, so that different prediction parameters can be applied to different real objects. Each coding unit may contain one or more prediction units.

Figure 12:
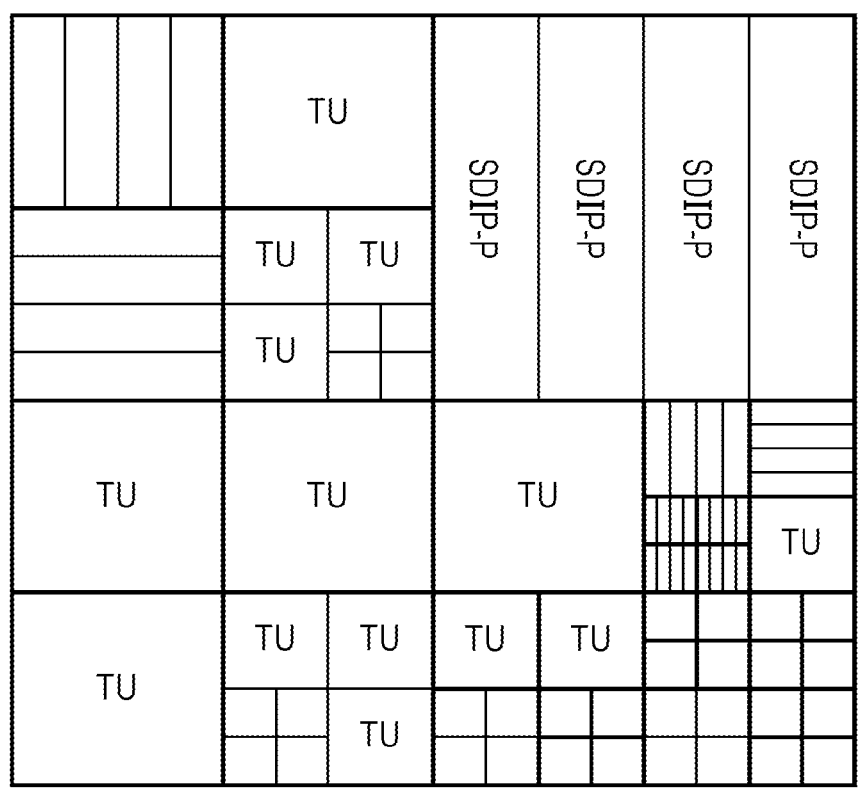
FIG. 12 schematically illustrates an array of transform units (TU)

FIG. 12 schematically illustrates an array of transform units (TU). A transform unit is a basic unit of the transform and quantisation process. Transform units are always square and can take a size from 4×4 up to 32×32 samples. Each coding unit can contain one or more transform units. The acronym SDIP-P in FIG. 12 signifies a so-called short distance intra-prediction partition. In this arrangement only one dimensional transforms are used, so a 4×N block is passed through N transforms with input data to the transforms being based upon the previously decoded neighbouring blocks and the previously decoded neighbouring lines within the current SDIP-P.

Figure 13:
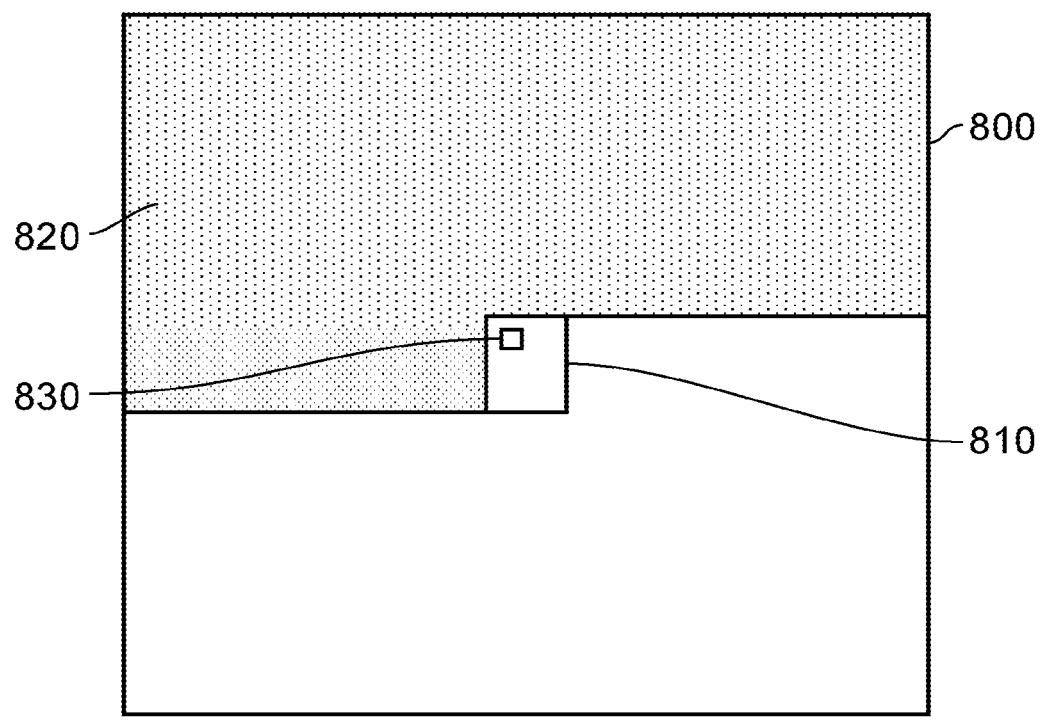
FIG. 13 schematically illustrates a partially-encoded image.

The intra-prediction process will now be discussed. In general terms, intra-prediction involves generating a prediction of a current block (a prediction unit) of samples from previously-encoded and decoded samples in the same image. FIG. 13 schematically illustrates a partially encoded image 800. Here, the image is being encoded from top-left to bottom-right on an LCU basis. An example LCU encoded partway through the handling of the whole image is shown as a block 810. A shaded region 820 above and to the left of the block 810 has already been encoded. The intra-image prediction of the contents of the block 810 can make use of any of the shaded area 820 but cannot make use of the unshaded area below that.

The block 810 represents an LCU; as discussed above, for the purposes of intra-image prediction processing, this may be subdivided into a set of smaller prediction units. An example of a prediction unit 830 is shown within the LCU 810.

The intra-image prediction takes into account samples above and/or to the left of the current LCU 810. Source samples, from which the required samples are predicted, may be located at different positions or directions relative to a current prediction unit within the LCU 810. To decide which direction is appropriate for a current prediction unit, the results of a trial prediction based upon each candidate direction are compared in order to see which candidate direction gives an outcome which is closest to the corresponding block of the input image. The candidate direction giving the closest outcome is selected as the prediction direction for that prediction unit.

The picture may also be encoded on a "slice" basis. In one example, a slice is a horizontally adjacent group of LCUs. But in more general terms, the entire residual image could form a slice, or a slice could be a single LCU, or a slice could be a row of LCUs, and so on. Slices can give some resilience to errors as they are encoded as independent units. The encoder and decoder states are completely reset at a slice boundary. For example, intra-prediction is not carried out across slice boundaries; slice boundaries are treated as image boundaries for this purpose.

Figure 14:
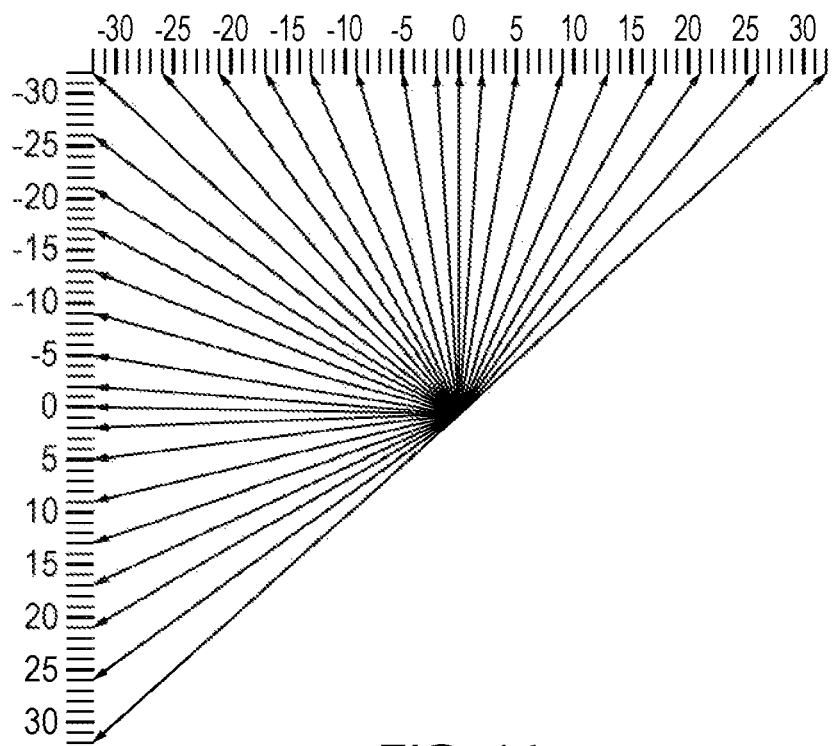
FIG. 14 schematically illustrates a set of possible prediction directions.
Figure 15:
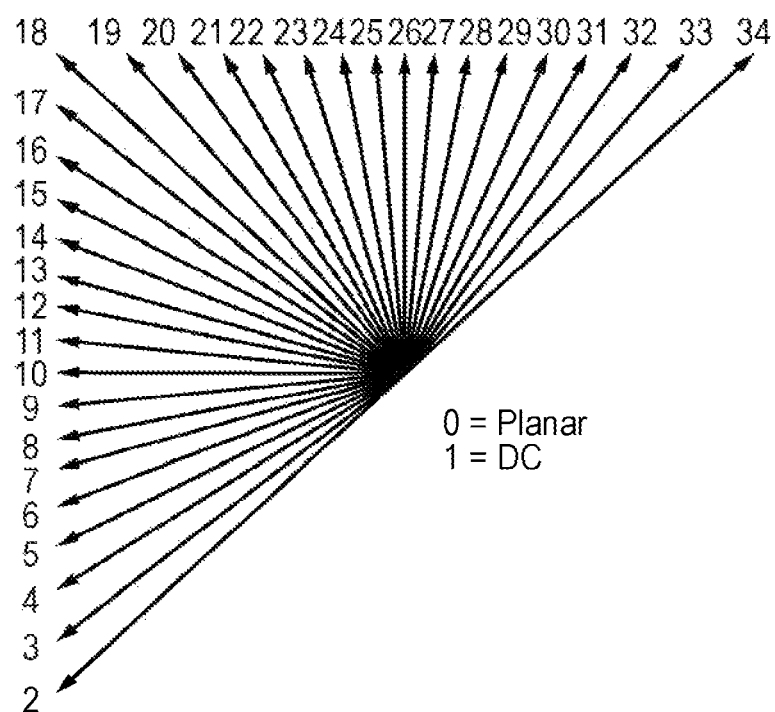
FIG. 15 schematically illustrates a set of prediction modes.

FIG. 14 schematically illustrates a set of possible (candidate) prediction directions. The full set of 34 candidate directions is available to a prediction unit of 8×8, 16×16 or 32×32 samples. The special cases of prediction unit sizes of 4×4 and 64×64 samples have a reduced set of candidate directions available to them (17 candidate directions and 5 candidate directions respectively). The directions are determined by horizontal and vertical displacement relative to a current block position, but are encoded as prediction "modes", a set of which is shown in FIG. 15. Note that the so-called DC mode, represents a simple arithmetic mean of the surrounding upper and left-hand samples.

Figure 16:
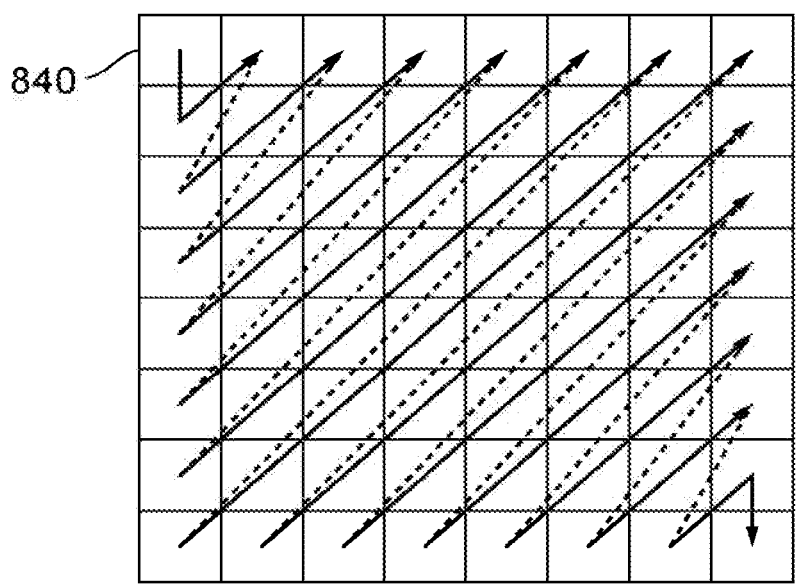
FIG. 16 schematically illustrates a zigzag scan.

FIG. 16 schematically illustrates a zigzag scan, being a scan pattern which may be applied by the scan unit 360. In FIG. 16, the pattern is shown for an example block of 8×8 transform coefficients, with the DC coefficient being positioned at the top left position 840 of the block, and increasing horizontal and vertical spatial frequencies being represented by coefficients at increasing distances downwards and to the right of the top-left position 840.

Note that in some embodiments, the coefficients may be scanned in a reverse order (bottom right to top, left using the ordering notation of FIG. 16). Also it should be noted that in some embodiments, the scan may pass from left to right across a few (for example between one and three) uppermost horizontal rows, before carrying out a zig-zag of the remaining coefficients.

Figure 17:
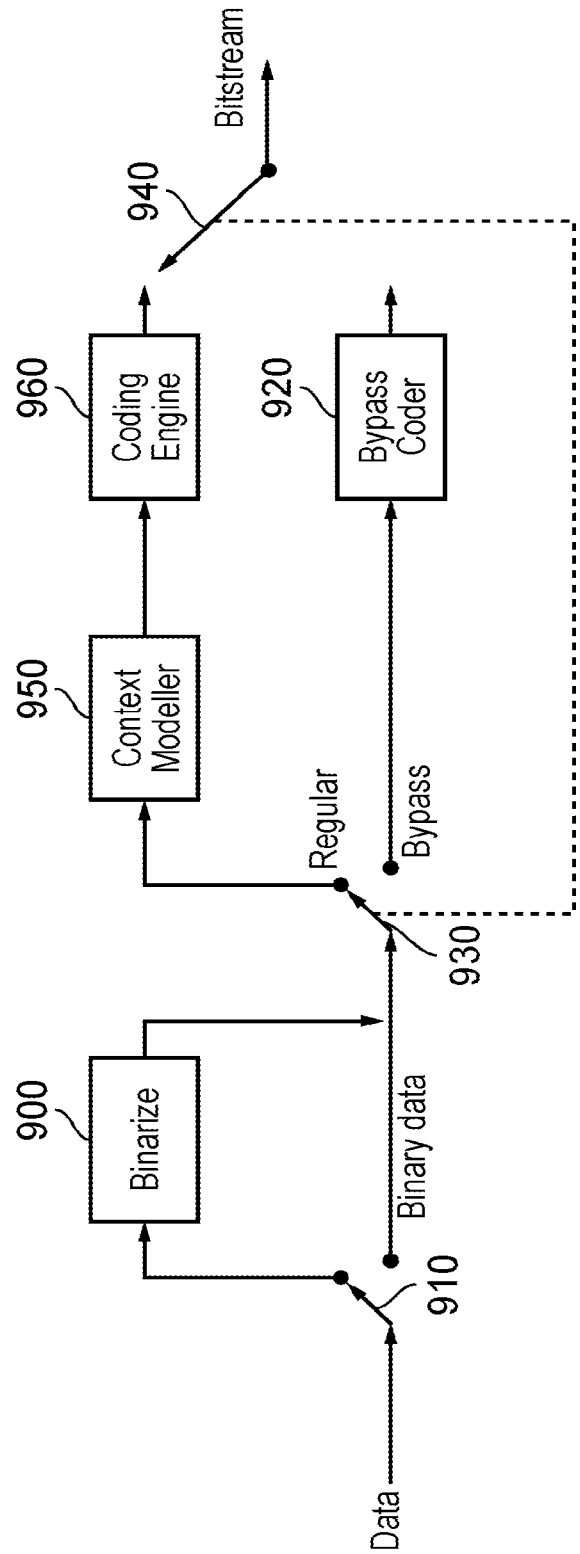
FIG. 17 schematically illustrates a CABAC entropy encoder.

FIG. 17 schematically illustrates the operation of a CABAC entropy encoder.

In context adaptive encoding of this nature and according to embodiments, a bit of data may be encoded with respect to a probability model, or context, representing an expectation or prediction of how likely it is that the data bit will be a one or a zero. To do this, an input data bit is assigned a code value within a selected one of two (or more generally, a plurality of) complementary sub-ranges of a range of code values, with the respective sizes of the sub-ranges (in embodiments, the respective proportions of the sub-ranges relative to the set of code values) being defined by the context (which in turn is defined by a context variable associated with or otherwise relevant to that input value). A next step is to modify the overall range, which is to say, the set of code values, (for use in respect of a next input data bit or value) in response to the assigned code value and the current size of the selected sub-range. If the modified range is then smaller than a threshold representing a predetermined minimum size (for example, one half of an original range size) then it is increased in size, for example by doubling (shifting left) the modified range, which doubling process can be carried out successively (more than once) if required, until the range has at least the predetermined minimum size. At this point, an output encoded data bit is generated to indicate that a (or each, if more than one) doubling or size-increasing operation took place. A further step is to modify the context (that is, in embodiments, to modify the context variable) for use with or in respect of the next input, data bit or value (or, in some embodiments, in respect of a next group of data bits or values to be encoded). This may be carried out by using the current context and the identity of the current "most probable symbol" (either one or zero, whichever is indicated by the context to currently have a greater than 0.5 probability) as an index into a look-up table of new context values, or as inputs to an appropriate mathematical formula from which a new context variable may be derived. The modification of the context variable may, in embodiments, increase the proportion of the set of code values in the sub-range which was selected for the current data value.

The CABAC encoder operates in respect of binary data, that is to say, data represented by only the two symbols 0 and 1. The encoder makes use of a so-called context modelling process which selects a "context" or probability model for subsequent data on the basis of previously encoded data. The selection of the context is carried out in a deterministic way so that the same determination, on the basis of previously decoded data, can be performed at the decoder without the need for further data (specifying the context) to be added to the encoded datastream passed to the decoder.

Referring to FIG. 17, input data to be encoded may be passed to a binary converter 900 if it is not already in a binary form; if the data is already in binary form, the converter 900 is bypassed (by a schematic switch 910). In the present embodiments, conversion to a binary form is actually carried out by expressing the quantised transform coefficient data as a series of binary "maps", which will be described further below.

The binary data may then be handled by one of two processing paths, a "regular" and a "bypass" path (which are shown schematically as separate paths but which, in embodiments discussed below, could in fact be implemented by the same processing stages, just using slightly different parameters). The bypass path employs a so-called bypass coder 920 which does not necessarily make use of context modelling in the same form as the regular path. In some examples of CABAC coding, this bypass path can be selected if there is a need for particularly rapid processing of a batch of data, but in the present embodiments two features of so-called "bypass" data are noted: firstly, the bypass data is handled by the CABAC encoder (950, 960), just using a fixed context model representing a 50% probability: and secondly, the bypass data relates to certain categories of data, one particular example being coefficient sign data. Otherwise, the regular path is selected by schematic switches 930, 940. This involves the data being processed by a context modeller 950 followed by a coding engine 960.

The entropy encoder shown in FIG. 17 encodes a block of data (that is, for example, data corresponding to a block of coefficients relating to a block of the residual image) as a single value if the block is formed entirely of zero-valued data. For each block that does not fall into this category, that is to say a block that contains at least some non-zero data, a "significance map" is prepared. The significance map indicates whether, for each position in a block of data to be encoded, the corresponding coefficient in the block is non-zero. The significance map data, being in binary form, is itself CABAC encoded. The use of the significance map assists with compression because no data needs to be encoded for a coefficient with a magnitude that the significance map indicates to be zero. Also, the significance map can include a special code to indicate the final non-zero coefficient in the block, so that all of the final high frequency/trailing zero coefficients can be omitted from the encoding. The significance map is followed, in the encoded bitstream, by data defining the values of the non-zero coefficients specified by the significance map.

Further levels of map data are also prepared and are CABAC encoded. An example is a map which defines, as a binary value (1=yes, 0=no) whether the coefficient data at a map position which the significance map has indicated to be "non-zero" actually has the value of "one". Another map specifies whether the coefficient data at a map position which the significance map has indicated to be "non-zero" actually has the value of "two". A further map indicates, for those map positions where the significance map has indicated that the coefficient data is "non-zero", whether the data has a value of "greater than two". Another map indicates, again for data identified as "non-zero", the sign of the data value (using a predetermined binary notation such as 1 for +, 0 for −, or of course the other way around).

In embodiments, the significance map and other maps are generated from the quantised transform coefficients, for example by the scan unit 360, and is subjected to a zigzag scanning process (or a scanning process selected from zigzag, horizontal raster and vertical raster scanning according to the intra-prediction mode) before being subjected to CABAC encoding.

In some embodiments, the HEVC CABAC entropy coder codes syntax elements using the following processes:

The location of the last significant coefficient (in scan order) in the TU is coded.

For each 4×4 coefficient group (groups are processed in reverse scan order), a significant-coefficient-group flag is coded, indicating whether or not the group contains non-zero coefficients. This is not required for the group containing the last significant coefficient and is assumed to be 1 for the top-left group (containing the DC coefficient). If the flag is 1, then the following syntax elements pertaining to the group are coded immediately following it:

Significance Map:
For each coefficient in the group, a flag is coded indicating whether or not the coefficient is significant (has a non-zero value). No flag is necessary for the coefficient indicated by the last-significant position.

Greater-than-One Map:
For up to eight coefficients with significance map value 1 (counted backwards from the end of the group), this indicates whether the magnitude is greater than 1.

Greater-than-Two Flag:
For up to one coefficient with greater-than-one map value 1 (the one nearest the end of the group), this indicates whether the magnitude is greater than 2.

Sign Bits:
For all non-zero coefficients, sign bits are coded as equiprobable CABAC bins, with the last sign bit (in reverse scan order) possibly being instead inferred from parity when sign bit hiding is used.

Escape Codes:
For any coefficient whose magnitude was not completely described by an earlier syntax element, the remainder is coded as an escape code.

In general terms, CABAC encoding involves predicting a context, or a probability model, for a next bit to be encoded, based upon other previously encoded data. If the next bit is the same as the bit identified as "most likely" by the probability model, then the encoding of the information that "the next bit agrees with the probability model" can be encoded with great efficiency. It is less efficient to encode that "the next bit does not agree with the probability model", so the derivation of the context data is important to good operation of the encoder. The term "adaptive" means that the context or probability models are adapted, or varied during encoding, in an attempt to provide a good match to the (as yet uncoded) next data.

Using a simple analogy, in the written English language, the letter "U" is relatively uncommon, But in a letter position immediately after the letter "Q", it is very common indeed. So, a probability model might set the probability of a "U" as a very low value, but if the current letter is a "Q", the probability model for a "U" as the next letter could be set to a very high probability value.

CABAC encoding is used, in the present arrangements, for at least the significance map and the maps indicating whether the non-zero values are, one or two, Bypass processing—which in these embodiments is identical to CABAC encoding but for the fact that the probability model is fixed at an equal (0.5:0.5) probability distribution of 1s and 0s, is used for at least the sign data and the map indicating whether a value is >2. For those data positions identified as >2, a separate so-called escape data encoding can be used to encode the actual value of the data. This may include a Golomb-Rice encoding technique.

The CABAC context modelling and encoding process is described in more detail in WD4: Working Draft 4 of High-Efficiency Video Coding, JCTVC-F803_d5, Draft ISO/IEC 23008-HEVC; 201x(E) 2011 Oct. 28.

The CABAC process will now be described in a little more detail.

CABAC, at least as far as it is used in the proposed HEVC system, involves deriving a "context" or probability model in respect of a next bit to be encoded. The context, defined by a context variable or CV, then influences how the bit is encoded. In general terms, if the next bit is the same as the value which the CV defines as the expected more probable value, then there are advantages in terms of reducing the number of output bits needed to define that data bit.

The encoding process involves mapping a bit to be encoded onto a position within a range of code values. The range of code values is shown schematically in FIG. 18A as a series of adjacent integer numbers extending from a lower limit, m_Low, to an upper limit, m_high. The difference between these two limits is m_range, where m_range=m_high−m_Low. By various techniques to be described below, in a basic CABAC system m_range is constrained to lie between 128 and 254; in another embodiment using a larger number of bits to represent m_range, m_range may lie between 256 and 510. m_Low can be any value. It can start at (say) zero, but can vary as part of the encoding process to be described.

The range of code values, m_range, is divided into two sub-ranges, by a boundary 1100 defined with respect to the context variable as:

$$\text{boundary}=m\_Low+(CV*m\_range)$$

So, the context variable divides the total range into two complementary sub-ranges or sub-portions of the set of code values, the proportions of the set assigned to each sub-range being determined by the variable CV, one sub-range being associated with a value (of a next data bit) of zero, and the other being associated with a value (of the next data bit) of one. The division of the range represents the probabilities assumed by the generation of the CV of the two bit values for the next bit to be encoded. So, if the sub-range associated with the value zero is less than half of the total range, this signifies that a zero is considered less probable, as the next symbol, than a one.

Various different possibilities exist for defining which way round the sub-ranges apply to the possible data bit values. In one example, a lower region of the range (that is, from m_Low to the boundary) is by convention defined as being associated with the data bit value of zero.

If more than one bit was being encoded at a single operation, more than two sub-ranges could be provided so as to give a sub-range corresponding to each possible value of the input data to be encoded.

The encoder and decoder maintain a record of which data bit value is the less probable (often termed the "least probable symbol" or LPS). The CV refers to the LPS, so the CV always represents a value of between 0 and 0.5.

A next bit is now mapped to the range m_range, as divided by the boundary. This is carried out deterministically at both the encoder and the decoder using a technique to be described in more detail below. If the next bit is a 0, a particular code value, representing a position within the sub-range from m_Low to the boundary, is assigned to that bit. If the next bit is a 1, a particular code value in the sub-range from the boundary 1100 to m_high is assigned to that bit. This represents an example of a technique by which embodiments may select one of the plurality of sub-ranges of the set of code values according to the value of the current input data bit, and, also an example of a technique by which embodiments may assign the current input data value to a code value within the selected sub-range.

The lower limit m_Low and the range m_range are then redefined so as to modify the set of code values in dependence upon the assigned code value (for example, which sub-range the assigned code value fell into) and the size of the selected sub-range. If the just-encoded bit is a zero, then m_Low is unchanged but m_range is redefined to equal m_range*CV. If the just-encoded bit is a one then m_Low is moved to the boundary position (m_Low+(CV*m_range)) and m_range is redefined as the difference between the boundary and m_high (that is, (1−CV)*m_range).

After such modification, a detection is made as to whether the set of code values is less than a predetermined minimum size (for example, is m_range at least 128).

Figure 18A:
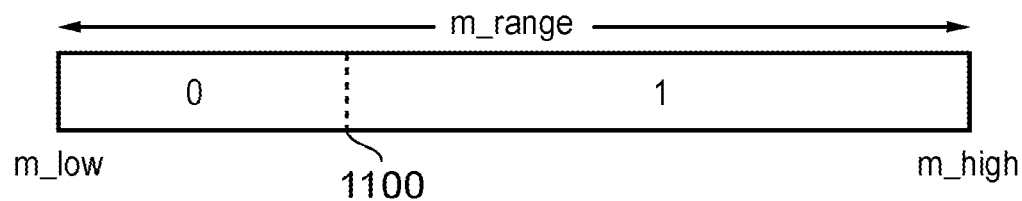
FIGS. 18A to 18D schematically illustrate aspects of a CABAC encoding and decoding operation.
Figure 18B:
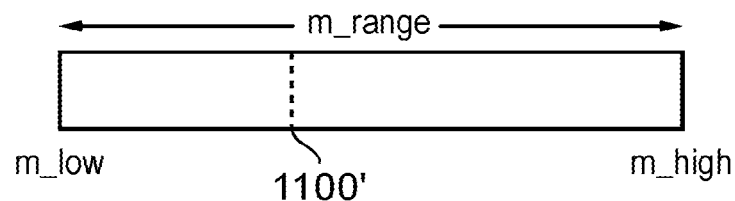
Figure 18C:
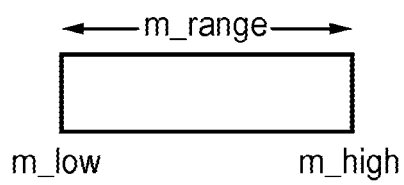

These alternatives are illustrated schematically in FIGS. 18B and 18C.

In FIG. 18B, the data bit was a 1 and so m_Low was moved up to the previous boundary position. This provides a revised or modified set of code values for use in a next bit encoding sequence. Note that in some embodiments, the value of CV is changed for the next bit encoding, at least in part on the value of the just-encoded bit. This is why the technique refers to "adaptive" contexts. The revised value of CV is used to generate a new boundary 1100'.

In FIG. 18C, a value of 0 was encoded, and so m_Low remained unchanged but m_high was moved to the previous boundary position. The value m_range is redefined or modified as the new values of m_high−m_Low.

Figure 18D:
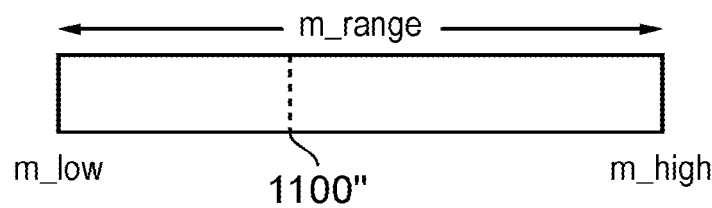

In this example, this has resulted in m_range falling below its minimum allowable value (such as 128). When this outcome is detected, the value m_range is renormalized or size-increased—which in the present embodiments is represented by m_range being doubled, that is, shifted left by one bit, as many times as are necessary to restore m_range to the required range of 128 to 256. An example of this is illustrated in FIG. 18D, which represents the range of FIG. 18C, doubled so as to comply with the required constraints. A new boundary 1100" is derived from the next value of CV and the revised m_range. Note that m_Low is similarly renormalized or size-increased whenever m_range is renormalized. This is done in order to maintain the same ratio between m_Low and m_range.

Whenever the range has to be multiplied by two in this way, an output encoded data bit is generated, one for each renormalizing stage.

In this way, the interval m_range and the lower limit m_Low are successively modified and renormalized in dependence upon the adaptation of the CV values (which can be reproduced at the decoder) and the encoded bit stream. After a series of bits has been encoded, the resulting interval and the number of renormalizing stage uniquely defines the encoded bitstream. A decoder which knows such a final interval would in principle be able to reconstruct the encoded data. However, the underlying mathematics demonstrate that it is not actually necessary to define the interval to the decoder, but just to define one position within that interval. This is the purpose of the assigned code value, which is maintained at the encoder and passed to the decoder at the termination of encoding the data.

To give a simplified example, consider a probability space divided into 100 intervals. In this case, m_Low would represent the bottom of a probability space, and 0 and m_Range would represent its size, (100). Assume for the purposes of this example that the context variable is set at 0.5 (as it is in respect of the bypass path), so the probability space is to be used to encode binary bits with fixed probability of 50%. However, the same principles apply if adaptive values of the context variable are used, such that the same adaptation process takes place at the encoder and the decoder.

For the first bit, each symbol (0 or 1) would have a symbol range of 50, with the input symbol 0 being assigned (say) the values 0 to 49 inclusive and the input symbol 1 being assigned (say) the values 50 to 99 inclusive, if a 1 is to be the first bit to be encoded, then the final value of the stream must lie in the 50 to 99 range, hence m_Low becomes 50 and m_Range becomes 50.

To encode the second bit, the range is further subdivided into symbol ranges of 25, with an input symbol of 0 taking the values 50 to 74 and an input symbol of 1 taking the values 75 to 99. As can be seen, whichever symbol is encoded as the second bit, the final value is still between 50 and 99, preserving the first bit, but now a second bit has been encoded into the same number. Likewise if the second bit were to use a different probability model to the first, it still wouldn't affect the encoding of the first bit because the range being subdivided is still 50 to 99.

This process continues at the encoder side for each input bit, renormalizing (for example, doubling) m_Range and m_Low wherever necessary, for example in response to m_Range dropping below 50. By the end of the encoding process (when the stream is terminated) the final value has been written to the stream.

At the decoder side, the final value is read from the stream (hence the name m_Value)—say for example, the value is 68. The decoder applies the same symbol range split to the initial probability space and compares its value to see which symbol range it lies in. Seeing that 68 lies in the 50 to 99 range, it decodes a 1 as the symbol for its first bit. Applying the second range split in the same way as the encoder, it sees that 68 lies in the 50 to 74 range and decodes 0 as the second bit, and so on.

In an actual implementation, the decoder may avoid having to maintain m_Low as the encoder does by subtracting the bottom value of each decoded symbol's range from m_Value (in this case, 50 is subtracted from m_Value to leave 18). The symbol ranges are then always subdivisions, of the 0 to (m_range−1) range (so the 50 to 74 range, becomes 0 to 24).

It is important to note that, if only two bits were to be encoded this way, the encoder could pick any final value within the 50 to 74 range and they would all decode to the same two bits "10" (one followed by zero). More precision is only needed if further bits are to be encoded and in practice, the HEVC encoder would always pick 50, the bottom of the range. The embodiments discussed in the present application seek to make use of that unused range by finding certain bits that, when set appropriately, guarantee the final value will decode correctly regardless of what the values of the remaining bits are, freeing those remaining bits for carrying other information. For example, in the sample encode given above, if the first digit were set to 6 (or 5), then the final value would always be in the 50 to 74 range regardless of the value of the second digit; hence the second digit can be used to carry other information.

As can be seen, an endless stream of bits can be coded using the same probability range (given infinite-precision fractions) by repeatedly subdividing it. In practice however, infinite precision is impossible and non-integer numbers are to be avoided. For this purpose, renormalisation is used. If the 50 to 74 range were to be used to encode a third bit, the symbol ranges would ordinarily have to be 12.5 intervals each, but instead, m_Range and m_Low can be doubled (or otherwise multiplied by a common factor) to 50 and 100 respectively and the symbol ranges would now be subdivisions of the range of 100 to 149 i.e. 25 intervals each. This operation is equivalent to retroactively doubling the size of the initial probability space from 100 to 200, Since the decoder maintains the same m_Range, it can apply renormalisation at the same times as the encoder.

The context variable CV is defined as having (in an example embodiment) 64 possible states which successively indicate different probabilities from a lower limit (such as 1%) at CV=63 through to a 50% probability at CV=0.

In an adaptive system CV is changed or modified from one bit to the next according to various known factors, which may be different depending on the block size of data to be encoded. In some instances, the state of neighbouring and previous image blocks may be taken into account. So, the techniques described here are examples of modifying the context variable, for use in respect of a next input data value, so as to increase the proportion of the set of code values in the sub-range which was selected for the current data value.

The functions of selecting a sub-range, assigning the current bit to a code value, modifying the set of code values, detecting whether the set is less than a minimum size, and modifying the context variable may all be carried out by the context modeller 950 and the coding engine 960, acting together. So, although they are drawn as separate items in FIG. 17 for clarity of the explanation, they act together to provide a context modelling and coding function. However, for further clarity, reference is made to FIG. 19 which illustrates these operations and functionalities in more detail.

The assigned code value is generated from a table which defines, for each possible value of CV and each possible value of bits 6 and 7 of m_range (noting that bit 8 of m_range is always 1 because of the constraint on the size of m_range), a position or group of positions at which a newly encoded bit should be allocated a code value in the relevant sub-range.

Figure 19:
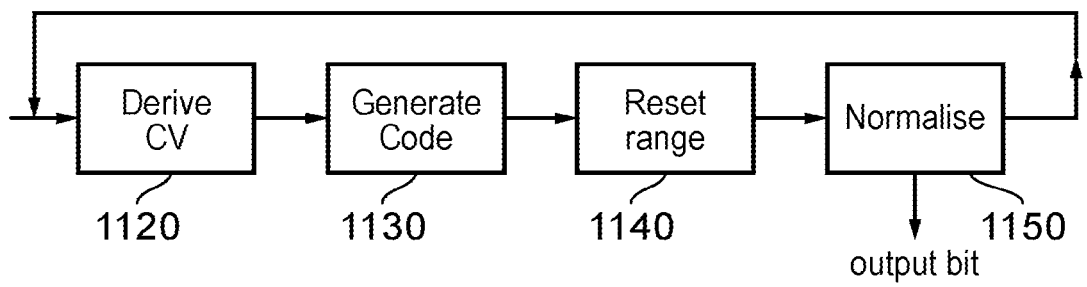
FIG. 19 schematically illustrates a CABAC encoder.

FIG. 19 schematically illustrates a CABAC encoder using the techniques described above.

The CV is initiated (in the case of the first CV) or modified (in the case of subsequent CVs) by a CV derivation unit 1120. A code generator 1130 divides the current m_range according to CV, selects a sub-range and generates an assigned data code within the appropriate sub_range, for example using the table mentioned above. A range reset unit 1140 resets m_range to that of the selected sub-range so as to modify the set of code values as described above. A normaliser 1150 detects whether the resulting value of m_range is below the minimum allowable value and, if necessary, renormalises the m_range one or more times, outputting an output encoded data bit for each such renormalisation operation. As mentioned, at the end of the process, the assigned code value is also output.

Figure 20:
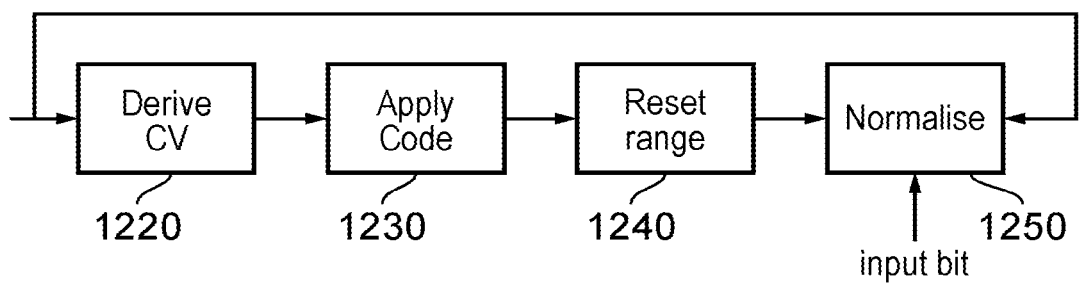
FIG. 20 schematically illustrates a CABAC decoder.

In a decoder, shown schematically in FIG. 20, the CV is initiated (in the case of the first CV) or modified (in the case of subsequent CVs) by a CV derivation unit 1220 which operates in the same way as the unit 1120 in the encoder. A code application unit 1230 divides the current m_range according to CV and detects in which sub-range the data code lies. A range reset unit 1240 resets m_range to that of the selected sub-range so as to modify the set of code values in dependence upon the assigned code value and the size of the selected sub-range. If necessary, a normaliser 1250 renormalises the m_range in response to a received data bit.

Embodiments provide a technique to terminate CABAC stream. The embodiments will be described in the context of an example system in which the code value range has a maximum value of 512 (instead of 128 as described above) and so is constrained to lie in the upper half of this range, that is, from 256 to 510.

The technique can produce a loss of on average 1.5 bits (which is to say, a much smaller loss than previous stream termination techniques caused). A second alternative method is also presented which can produce an average loss of 1 bit. Applications of these techniques have been suggested to include termination of the CABAC stream prior to sending IPCM (non-frequency separated) data, and termination of the stream for row-per-slice. The technique is based on the recognition that the CABAC variable can be set to any value within the correct range at the time of termination. So the CABAC variable is set to a value which has a number of trailing (least significant bit) zeros, so that when the value is flushed to the data stream, the zeros can effectively be ignored.

In current techniques, terminating a CABAC stream causes 8 bits to be flushed to the data stream (that is, lost or wasted) The technique is illustrated with an example where intra frames are terminated after each LCU or image slice (that is, after encoding a group of data values representing data values relating to a particular respective image sub-area), allowing the coefficient bypass data (sign bits/escape codes) to be placed into the bit-stream in a raw format.

A process to terminate the CABAC stream is applied at the end of each slice and prior to IPCM data. In embodiments this process assumes (for the purposes of this discussion) that the probability that the stream is to be terminated is fixed at on average 0.54%. (When a data value (1 or 0) is encoded, the current m_range is subdivided into two symbol ranges, representing the probability of 1 or 0 respectively. For the special "end-of-stream flag" value, the symbol range for 1 is always 2. Hence the probability of the data value being 1 is dependent on the value of the current m_range. In some embodiments, as discussed above, m_range may vary between 256 and 510, so the termination probability therefore varies between 2/510=0.3922% and 2/256=0.7813%).

For the encoder, this process is:
 if the stream is not to be terminated, the CABAC range m_range is decremented by 2, and the CABAC engine is renormalized by 1 place if required (which is to say that m_Low and m_range are renormalized); processing on the current CABAC stream continues.
 if the stream is to be terminated, the CABAC 'm_Low' is incremented by 'the range less 2', the range is set to 2, and the CABAC engine is renormalized by 7 places, followed by outputting a further binary '1', This process is equivalent to a renormalization of 8 places, where the value being renormalized has been forced to be an odd number.

There may be occasions where the above process is not ideal—i.e. where the probability of the stream is variable, or fixed at a higher percentage, or even a certainty (probability of 1).

Embodiments can provide a method whereby the CABAC stream can be immediately terminated with just 2 renormalizations, with a loss of (on average) 1.5 bits and negligible impact on the decoder and encoder complexity. An alternative method is also indicated that can reduce the overhead to just 1 bit, but at the expense of an increase in CABAC decoder complexity. Both methods can then be used in conjunction with a standard adaptive context variable if there is a variable probability of termination, or in conjunction with a fixed percentage mechanism (akin to a non-adaptive context variable).

Note that as discussed above, m_Low and m_Range are renormalised together.

1 Algorithm 1.1 Method

The steps of the encoder are as follows:

```
m_Low= (m_Low+128) &~127
{or m_Low=(m_Low+127) &~127}
Force 2 stages of renormalization of m_Low and call
test_write_out ( )
[write the value to the stream]
Prior to encoding next CABAC stream,
set m_Range=510, m_Low=0.
```

Notation: & is an AND operation, and ~ signifies the binary inverse (so ~127 is the binary inverse of the binary value corresponding to decimal 127, so that an AND operation with the binary inverse of a number such as decimal 127 (which has a plurality of least significant bits or LSBs equal to 1) is equivalent to setting that number of LSBs of the resulting value to zero). The function test_write_out( ) checks whether any bits at the top (MSB end) of m_Low are eligible to be sent to the output stream, writing them if so. In the context of, the pseudo-code shown above, the new bits created by the "forced renormalisation" will be written by this operation.

The steps of the decoder are as follows:

```
Rewind input stream by 7 bits (i.e. move read position
back by 7 bits).
Prior to decoding next CABAC stream, set m_Range=0,
and read m_value from bit-stream.
```

This method has a low processing impact on the decoder and encoder.

In respect of m_Low, note that the encoder generates a stream by repeatedly adding to m_Low. The decoder reads that stream by starting with the encoder's final result and repeatedly subtracting from it. The decoder calls the bits read from the stream "m_uiValue" (or m_value in the notation of this description) rather than m_Low and it is this that should be read from the bit stream. This is relevant in this case where some embodiments require that the decoder maintain m_Low as well as m_uiValue so it knows what the encoder is doing. In that case, m_Low is generated at the decoder in exactly the same way as the encoder's m_Low.

Alternative Method

This method increases the complexity of current decoders as it requires that the decoder maintains m_Low. If maintenance of m_Low is required by other proposals, then this additional complexity is again minimal.

The steps of the encoder are as follows:

```
Let test256= (m_Low+255) &~255
If (test256+256 < m_Low+m_Range)
   m_Low=m_test256
   Force 1 stage of renormalization of m_Low and call
test_write_out ( ) .
Else (as before)
   m_Low=(m_Low+128)&~127        { or m_Low=
(m_Low+127)&~127 )
   Force 2 stages of renormalization of m_Low and
call test_write_out ( ) .
Prior to encoding next CABAC stream,
set m_Range=510, m_Low=0 .
```

The steps of the decoder are as follows:

```
Let test256=(m_Low+255)&~255
If (test256+256 < m_Low+m_Range)
   Rewind stream by 8 bits
Else (as before)
   Rewind stream by 7 bits
Prior to decoding next CABAC stream, set m_Range=0,
set m_Low = 0 and read m_value from bit-stream.
```

Theory

For the CABAC encoder, the data written to the stream (or buffered) is concatenated with m_Low is an n-bit value low indicating the lowest value that the final output can be. The highest value, high, is the sum of low and m_Range, a variable maintained by the encoder to be within the range 256 (inclusive) to 511 (exclusive). At the end of the stream, any value between low (inclusive) and high (exclusive) can be selected as the final output value, without affecting the decode. If the decode could occur without being dependent on the n LSBs of the value, then the n LSBs could be replaced with data from the next section of the bit-stream.

Let v be a value between low and high where n LSBs are 0, and where if the last n LSBs were 1, the resulting value V would still be less than high. Since "high-low" is at least 256, then there will always be a value v between low and high that has at least 7 LSBs that are 0, i.e. the value v is the first value between low and high that is divisible by 128 without a remainder.

The simplest manner to achieve this is a standard power-of-2 alignment routine, namely:

$v=(low+127)\&\sim 127$

However, since range is at least 256, then:

$v=(low+128)\&\sim 127$ is also sufficient (and results in a slightly smaller encoder).

For the current part of the bit-stream, the encoder would output the value 'v', except for the bottom 7 bits, this is achieved by renormalizing m_Low by 2 places. At the end of the bit-stream, the decoder would have read 7 bits from the next section of the bit stream, and therefore would have to 'rewind' the bit-stream by 7 bits.

There are cases where the bottom 8 bits are not required to fully decode the stream, with the simplest illustration being where "m_Low=0", and these are explored by the alternative algorithm. In this alternative algorithm, the value v between low and high with 8 LSBs of 0 is calculated, and then a test is applied to check if there is a corresponding value V. The decision process requires tests on low and high, and since the decoder must also make the same decision, the decoder would need to track m_Low.

In both versions of the encoder algorithm, there is a choice for the 7-bit path, which will result in a different bit-stream, but will be decodable by the same decoder.

With reference to FIG. 19 described above, the units 1120 and 1130 represent embodiments of a selector to select one of a plurality of complementary sub-ranges of a set of code values, and a data assigning unit to assign the current input value to a code value. The unit 1140 represents an embodiment of a data modifying unit. The unit 1150 represents an embodiment of a detector for detecting whether the set of code values is less than a minimum size and to carry out the other functions of that detector accordingly. The unit 1150 also represents an embodiment of a data terminator by carrying out the data termination functionality described above and that described below, and in particular by making the decision as to when to terminate the stream.

With reference to FIG. 20 described above, the units 1220, 1230, 1240 and 1250 collectively represent embodiments of a pointer controller and a setting unit, in that they are operable to carry out the functionality described above in respect of these units.

Applications

Possible applications for this include:

1. Termination for the last encoded LCU for a slice, especially in a 'row-per-slice' style configuration, where the probability may be significantly higher than 0.54%; in this arrangement, embodiments can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values corresponding to a set of blocks of video data within a slice of the video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

2. Termination for the last possible LCU for a slice, as termination after the last possible LCU of a slice is a certainty; in this arrangement, embodiments can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values representing the whole of a slice of video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

3. Termination prior to IPCM data, possibly in conjunction with a context variable in this arrangement, embodiments can provide a data encoding method for encoding successive input data values representing frequency separated video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values such that a next group of data values to be encoded represent non-frequency-separated video data, terminating the output data by: setting a value defining an end of the set of code values to a value having a plurality of least significant bits equal to zero; increasing the size of the set of code values; and writing the value defining the end of the set of code values to the output data.

4. Termination of the stream to prevent the "bits outstanding" mechanism getting too long; in this arrangement, embodiments can provide a data encoding method for encoding successive input data values, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; detecting whether a set of data values to be encoded by a different encoding technique exceeds a predetermined size, and if so, terminating the output data by: setting a value defining an end of the set of code values to a value having a plurality of least significant bits equal to zero; increasing the size of the set of code values; and writing the value defining the end of the set of code values to the output data.

The following part of the description is concerned with extending the operation of encoders and decoders such as those described above to operation at higher video resolutions and correspondingly low (including negative) QPs. Low operating QPs may be needed if the codec is to truly support high bit depths. Possible sources of errors that may be caused by internal accuracy limitations present in encoders and decoders such as those defined by HEVC will be discussed. Some changes to those accuracies can mitigate the errors and thereby extend the operating range of HEVC. In addition, changes to the entropy coding are presented.

At the time of filing the present application, HEVC Version 1 describes an 8 and 10 bit codec; Version 2 is to include 12 and 14 bit operation. Although the test or demonstration software has been written to allow input data bit depths up to 14, the ability of the codec to code 14 bits does not necessarily correspond to the way that the codec handles 8 or 10 bit resolution data. In some instances the internal processing may introduce noise, which can lead to an effective loss of resolution. For example, if the peak signal to noise ratio (PSNR) for 14-bit input data is so low that the least-significant two bits are effectively reduced to noise, then the codec is effectively only operating at 12-bit resolution. It is therefore appropriate to aim towards a system having internal operating functions which allow higher resolution input data to be used (for example, 12 or 14 bit resolution input data) without introducing so much noise, errors or other artefacts as to reduce the effective (useful) resolution of the output data by a significant amount.

The term "bit depth" and the variable bitDepth are used here to indicate the resolution of the input data and/or (according to the textual context) of the data processing carried out within the codec (the latter being also known as "internal bit depth" using HEVC software demonstration model terminology). For example, for 14-bit data processing, bitDepth=14.

In the context of the 8 and 10 bit codec, quantisation parameters (QPs) in the positive range (QP>0) are discussed. However, for each additional, bit (over 8 bits) in the resolution of the input data, the minimum allowable QP (minQP) can be 6 lower than 0, or in other words:

$$\text{minQP} = -6*(\text{bitDepth}-8)$$

The variable "PSNR", or peak SNR, is defined as function of meant-square error (MSE) and bit depth:

$$\text{PSNR} = 10*\log_{10}(((2^{bitDepth})-1)^2/\text{MSE})$$

Figure 23:
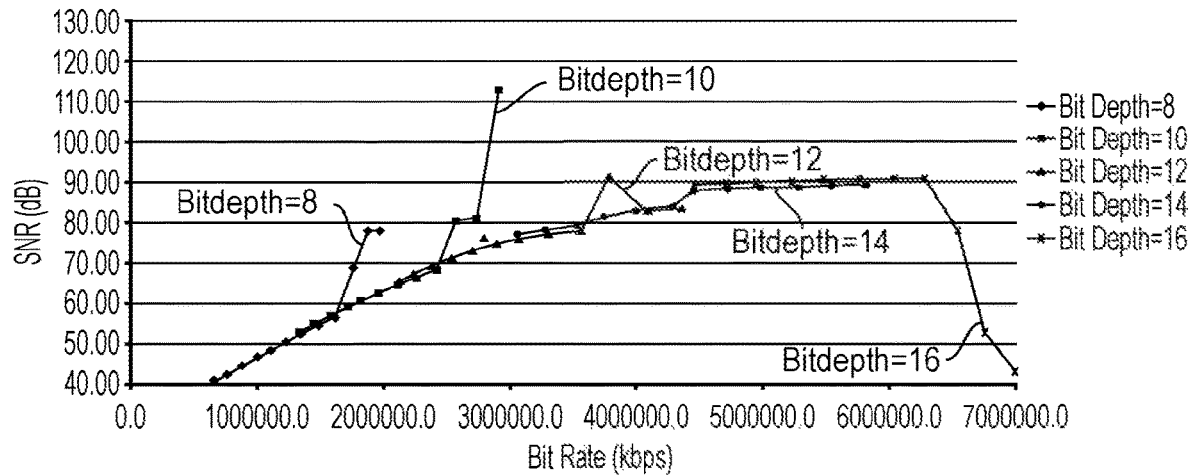
FIG. 23 is a graph of bit rate against green channel PSNR for six test bit depths, with a transform skip mode enabled.

As can be seen in FIG. 23, to be discussed below, no matter what value of the internal processing bit depth of the example codec implementation, the general trend is that the PSNR curves peak at around 90 dB; for more negative QPs (than the QP corresponding to the peak of the PSNR curve), the PSNR performance actually degrades.

Using the equation for PSNR, the following table of PSNRs for given bit depths and MSE can be derived:

| | Bit depth | | | | | | | | |
|---|---|---|---|---|---|---|---|---|---|
| MSE | 8 | 9 | 10 | 11 | 12 | 13 | 14 | 15 | 16 |
| 0.25 | 54.2 | 60.2 | 66.2 | 72.2 | 78.3 | 84.3 | 90.3 | 96.3 | 102.4 |
| 0.5 | 51.1 | 57.2 | 63.2 | 69.2 | 75.3 | 81.3 | 87.3 | 93.3 | 99.3 |
| 1 | 48.1 | 54.2 | 60.2 | 66.2 | 72.2 | 78.3 | 84.3 | 90.3 | 96.3 |
| 1.5 | 46.4 | 52.4 | 58.4 | 64.5 | 70.5 | 76.5 | 82.5 | 88.5 | 94.6 |
| 2 | 45.1 | 51.2 | 57.2 | 63.2 | 69.2 | 75.3 | 81.3 | 87.3 | 93.3 |
| 4 | 42.1 | 48.1 | 54.2 | 60.2 | 66.2 | 72.2 | 78.3 | 84.3 | 90.3 |
| 5.5 | 40.7 | 46.8 | 52.8 | 58.8 | 64.8 | 70.9 | 76.9 | 82.9 | 88.9 |
| 8 | 39.1 | 45.1 | 51.2 | 57.2 | 63.2 | 69.2 | 75.3 | 81.3 | 87.3 |
| 16 | 36.1 | 42.1 | 48.2 | 54.2 | 60.2 | 66.2 | 72.2 | 78.3 | 84.3 |
| 21.5 | 34.8 | 40.8 | 46.9 | 52.9 | 58.9 | 64.9 | 71.0 | 77.0 | 83.0 |
| 32 | 33.1 | 39.1 | 45.1 | 51.2 | 57.2 | 63.2 | 69.2 | 75.3 | 81.3 |
| 64 | 30.1 | 36.1 | 42.1 | 48.2 | 54.2 | 60.2 | 66.2 | 72.2 | 78.3 |

If a 14-bit codec is only able to achieve a PSNR of 72.2 dB, then each output value is only accurate to within the range of ±4 of the corresponding original value. The two least significant bits are therefore effectively noise, so the codec is really equivalent to a 12-bit codec with two additional random bits added at the output. (It is important to note that this analysis is based upon averages, and that actually in some parts of the picture, better or worse quality than this average may be achieved).

Extending this argument, when comparing PSNRs in this purely numerical fashion, it could be thought that the best system would therefore in fact be an 8-bit system with lossless encoding, achieving an infinite PSNR (MSE=0). However, this does not take into account the loss in initially rounding or truncating the video from n bits (where n is originally higher than 8) down to 8 bits. This approach can be generalised according to the following examples:

If a lossless (n−1)-bit system were available to encode the n-bit data, then at the output, the n-bit MSE observed would be $(0+1^2)/2=0.5$.

If a lossless (n−2)-bit system were available to encode the n-bit data, then at the output, the n-bit MSE observed would be $(0+1^2+2^2+1^2)/4=1.5$.

If a lossless (n−3)-bit system were available to encode the n-bit data, then at the output, the n-bit MSE observed would be $(0+1^2 2^2+3^2+4^2+3^2+2^2+1^2)/8=5.5$.

If a lossless (n−4)-bit system were available to encode the n-bit data, then at the output, the n-bit MSE observed would be:

$(0+1^2+2^2+3^2+4^2+5^2+6^2+7^2+8^2+7^2+6^2+5^2+4^2+3^2+2^2+1^2)/16=21.5$.

Therefore, returning to the specific example, if the 14-bit system does not achieve an MSE of 21.5 or less (equivalent to 71.0 dB) and if the bit rate of a lossless 10-bit system were similar, then numerically speaking, only 10 bits are effectively being coded.

Consider a lossy, low bit depth (n−r)-bit system with MSE of 'm'. If this system is used to code higher bit depth n-bit data, its MSE will therefore be given by $(2^r)^2 m$.

For example, for a lossy (n−1)-bit system, MSE in an n-bit system would be 4m; for a lossy (n−2)-bit system, MSE in an n-bit system would be 16m; for a lossy (n−3)-bit system, MSE in an n-bit system would be and for a lossy (n−4)-bit system, MSE in an n-bit system would be 256m.

Therefore for the case where lossy lower bit depth systems encode higher (n-bit) bit depth data, their loss is generally the main contributor for the MSE observed in the n-bit domain, so simple PSNR figures can be used as straight comparisons of quality.

An implementation of a HEVC encoder (at the time of filing the application) peaks at 90 dB (as shown in FIG. 23); this may be considered suitable for encoding 11-bit data, but at this operating point, the matter of whether any further improvement can be gained will be discussed below.

First, the potential sources of error will be discussed.

The core HEVC system (version 1) has been designed for 8 and 10 bit operation. As the number of bits increases, the internal accuracies of parts of the system may become relevant as potential sources of error, noise or artefacts leading to an effective loss of overall resolution.

Figure 21:
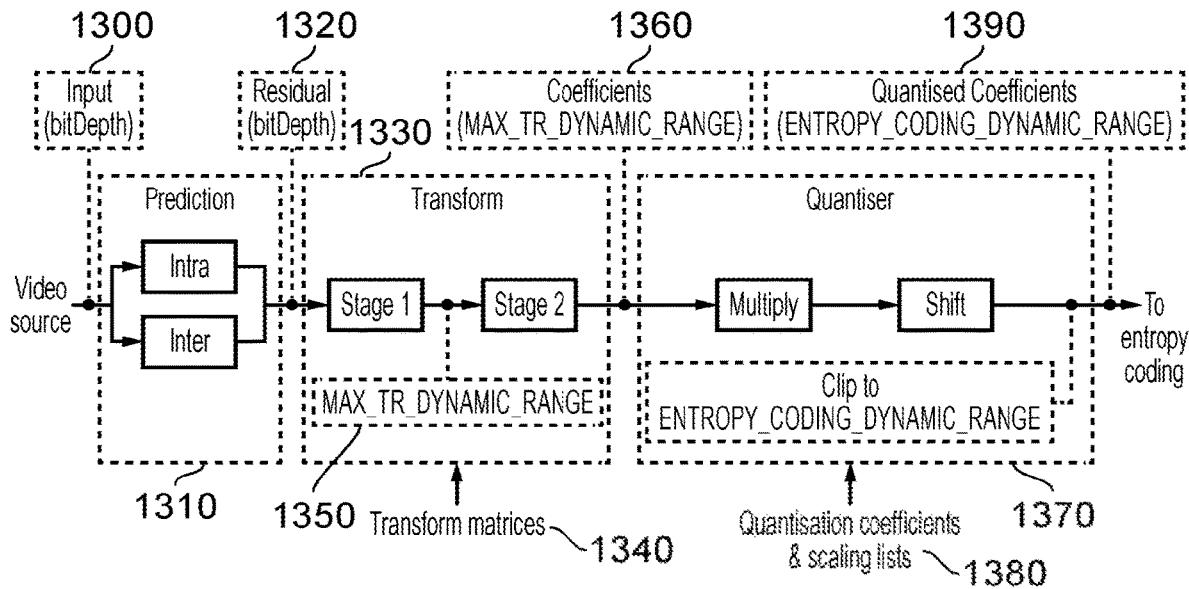
FIG. 21 is a schematic diagram showing an overview of an encoding system.

A simplified schematic diagram illustrating a flow of data through an encoder of the types discussed above, such as a HEVC encoder, is shown in FIG. 21. A purpose of summarising the process in the form shown in FIG. 21 is to indicate the potential limitations on operating resolution within the system. Note that for this reason, not all of the encoder functionality is shown in FIG. 21.

Input data 1300 of a certain bit depth is supplied to a prediction stage 1310 which performs either intra- or inter-prediction and subtracts the predicted version from the actual input image, generating residual data 1320 of a certain bit depth. So, the stage 1300 generally corresponds to the items 320 and 310 of FIG. 5.

The residual data 1320 is frequency-transformed by a transform stage 1330 which involves multiple stages of transform processing (labelled as stage 1 and stage 2), corresponding to left and right metric multiplications in the 2D transform equation, and operates according to one or more sets of transform matrices 1340 (the transforms can be implemented by a matrix multiplication process) having a certain resolution. A maximum dynamic range 1350 of the transform process, referred to as MAX_TR_DYNAMIC_RANGE, applies to the calculations used in this process. The output of the transform stage is a set of transform coefficients 1360 according to the MAX_TR_DYNAMIC_RANGE. The transform stage 1330 corresponds generally to the transform unit 340 of FIG. 5.

The coefficients 1360 are then passed to a quantising stage 1370 generally corresponding to the quantiser 350 of FIG. 5. The quantising stage may use a multiply-shift mechanism under the control of quantisation coefficients and scaling lists 1380, including clipping to the maximum dynamic range ENTROPY_CODING_DYNAMIC_RANGE (which is, in embodiments, the same as MAX_TR_DYNAMIC_RANGE), The output of the quantising stage is a set 1390 of quantised coefficients according to ENTROPY_CODING_DYNAMIC_RANGE which is then (in the full encoder, not shown here) passed to an entropy encoding stage such as that represented by the scan unit 360 and entropy encoder 370 of FIG. 5.

Using the notation introduced in respect of FIG. 21, the main sources of calculation noise, ignoring (for the purposes of this discussion) noise shaping caused by the various predictions and the RQT (residual quad-tree) and RDOQ (rate distortion optimized quantisation) decision processes, in HEVC are discussed below:

Transform Matrix Coefficient Values

Ideally, the inverse transform applied to transformed coefficients will reproduce the original input values. However, this is limited by the integer nature of the calculations. In HEVC, the transform matrix coefficients have 6 fractional bits (i.e. they have an inherent left-shift of 6).

Shifting Results to MAX_TR_DYNAMIC_RANGE after Each Stage of the Transform

The forward transform will result in values that are bitDepth+$\log_2$(size) bits in size. After the first stage of the transform, the coefficients' width in bits should be at least bitDepth+$\log_2$(size) (though additional bits will help maintain more accuracy). However, in HEVC, these intermediates are shifted in the forward (encoder only) transform so that they never exceed MAX_TR_DYNAMIC_RANGE; similarly for the second stage. In the inverse transform, the values at the output of each stage are clipped to MAX_TR_DYNAMIC_RANGE.

If MAX_TR_DYNAMIC_RANGE is less than bitDepth+$\log_2$ (size), then the values out of the forward transform will actually be shifted left (instead of right) in the quantising stage, and then clipped to 15-bit (ENTROPY_CODING_DYNAMIC_RANGE). Actually, if ENTROPY_CODING_DYNAMIC_RANGE is less than bitDepth+log2(size)+1, clipping will occur when OP is less than (4−(6*(bitDepth−8))).

In HEVC, MAX_TR_DYNAMIC_RANGE (and ENTROPY_CODING_DYNAMIC_RANGE of 15 is used for up to 10 bit operation, although coefficients in 32×32 blocks may be clipped for QP<−8, In addition, the lack of headroom for internal accuracy may also introduce errors for low QPs.

Noise Added During Quantisation

Although the quantiser and inverse quantiser of an encoder and decoder will add noise when quantising, additional noise may be inadvertently added when the scaling lists are applied, and because the quantisation coefficients defined in the arrays 'quantScales' and 'invQuantScales' are not necessarily perfect reciprocals.

The effects of transform matrix precision and MAX_TR_DYNAMIC_RANGE are discussed below.

Empirical data was obtained by analysis (under the so-called intra coding profile) of the coding of five video sequences from the so-called SVT test set (1920×1080 50 p at 16 bit, scaled down from 4K video). Of these sequences, only the first 150 frames have been used in the tests. A sixth sequence, referred to as Traffic_RGB (2560×1600 30 p at 12 bit) is defined by the standard Range Extension test conditions applicable to HEVC at the time of filing the present application.

In the empirical tests, if the file (input data) bit depth was less than the internal bit depth being tested (the codec's input bit depth), then the samples were padded (with the LSBs set to 0); if the file bit depth was more than the internal bit depth, the samples were scaled and rounded.

In the discussion below, bitDepth is used to describe the internal bit depth rather than the bit depth of the input data. Systems with internal bit depth (bitDepth) up to 16 are considered.

Figure 22:
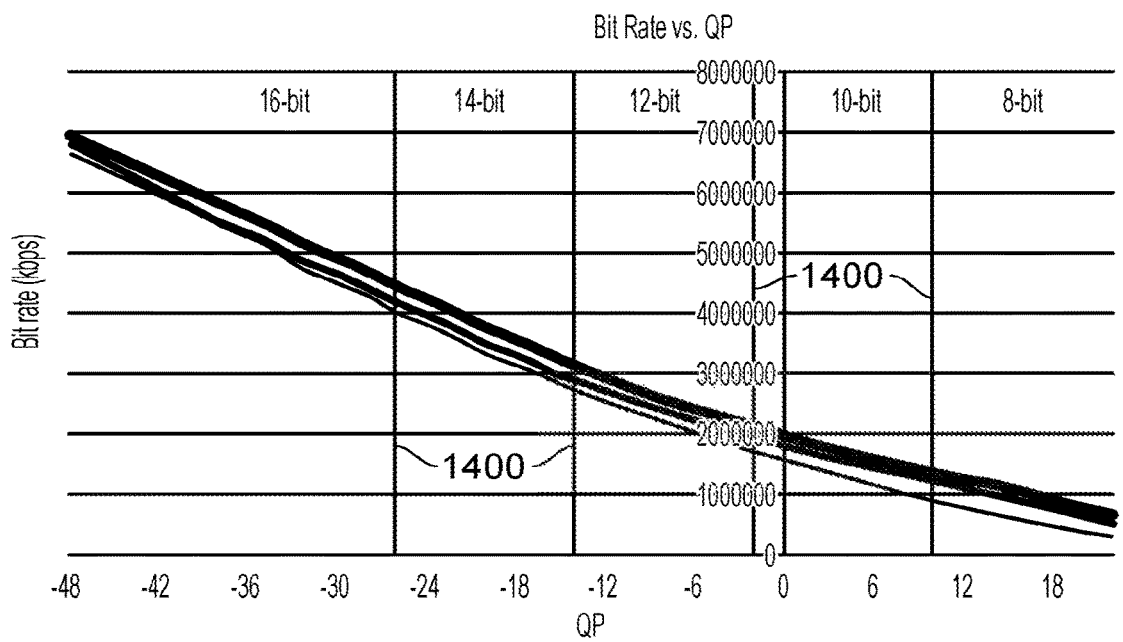
FIG. 22 is a graph of bit rate against quantisation parameter (QP)

FIG. 22 is a graph of bit rate against quantisation parameter (QP) which schematically illustrates the empirical performance of the encoder system of FIG. 21 at a number of internal bit depths. FIG. 23 is a graph of PSNR for the green channel (on the basis that it is easier to obtain empirical data for one channel, and green is the channel which contributes the most to the viewer's perception of the output video), against QP. The graphs of FIG. 22 are formed from a composite of data for 16-bit (QP −48 to −26), 14-bit (QP −24 to −14), 12-bit (QP −12 to −2). 10-bit (QP 0 to 10) and 8-bit (QP 12 to 22) processing. Vertical lines 1400 schematically indicate the points at which the bit depth changes. The multiple curves in FIG. 22 correspond to results obtained with different respective test sequences.

FIG. 22 shows that the bit rate changes generally monotonically with QP.

Figure 24:
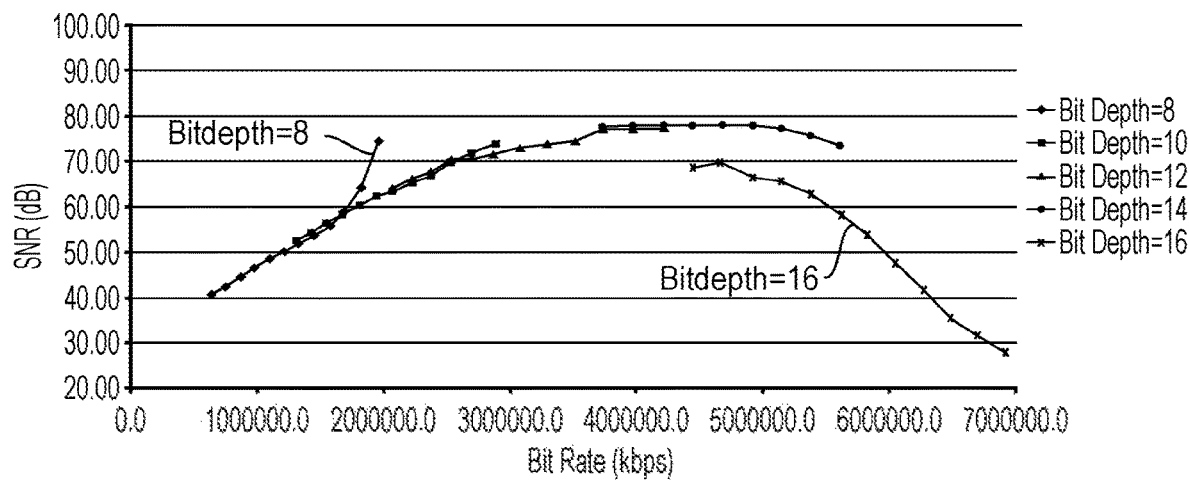
FIG. 24 is a graph of bit rate against green channel PSNR for six test bit depths, with a transform skip mode disabled.

Referring to FIG. 23, the PSNR for bitDepth=8 and bitDepth=10 increases sharply at QPs of 4 and below (rightmost three data points on each curve). At QP 4, the quantisation divisor for 8-bit is 1 (QP −8 for 10 bit), leaving the mismatch between the DCT and IDCT and between the quantisation and dequantisation coefficients as the only probable sources of error. As the system tends towards lossless processing, the MSE approaches zero and the SNR spikes upward FIG. 24 is a graph of PSNR against bit rate for one test sequence at a series of different internal bit depths (8, 10, 12, 14, 16). The five curves overlie one another almost exactly for most of their range and so cannot easily be distinguished.

A 10-bit system at the same operating point has errors mainly in the two least significant bits, meaning it also approaches lossless processing when considering only 8-bit accuracy, but as indicated elsewhere in this description, the act of converting 10-bit video to 8-bit video must also be considered. This will add a MSE of 1.5, which is hidden (that is to say, not shown explicitly as a result in these empirical tests but still resulting in a higher overall SNR) when considering a lower accuracy.

Figure 25:
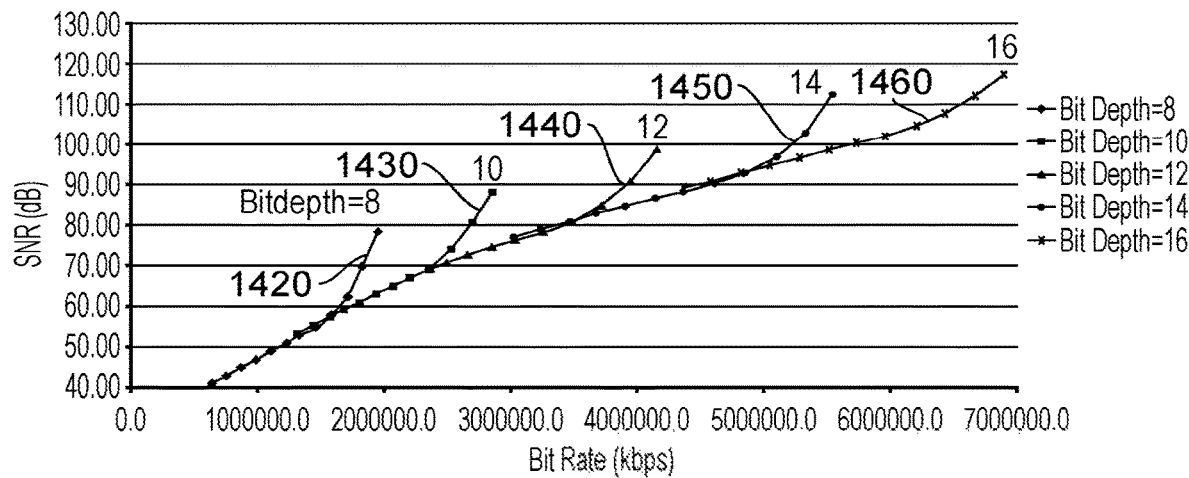
FIG. 25 is a graph of bit against green channel PSNR for six test bit depths, with 14 bit transform matrices.

In systems that are not limited by internal accuracy to a peak SNR, this increase towards lossless processing can be seen for each bitDepth as QP drops below (4−(6*(bitDepth−8))). This is shown in FIG. 25, which is a graph of green channel PSNR against bit rate for a range of bit depths (8, 10, 12, 14, 16) with MAX_TR_DYNAMIC_RANGE=21, ENTROIPY_CODING_DYNAMIC_RANGE=21 and 14 bit transform matrices, with RDOQ disabled and transform skip disabled. The five curves overlie one another except for portions 1420 (of the 8 bit curve), 1430 (of the 10 bit curve), 1440 (of the 12 bit curve), 1450 (of the 14 bit curve) and 1460 (of the 16 bit curve). It can be seen that, for the same number of bits, significantly higher SNRs are achievable than those shown in FIG. 24.

Figure 26:
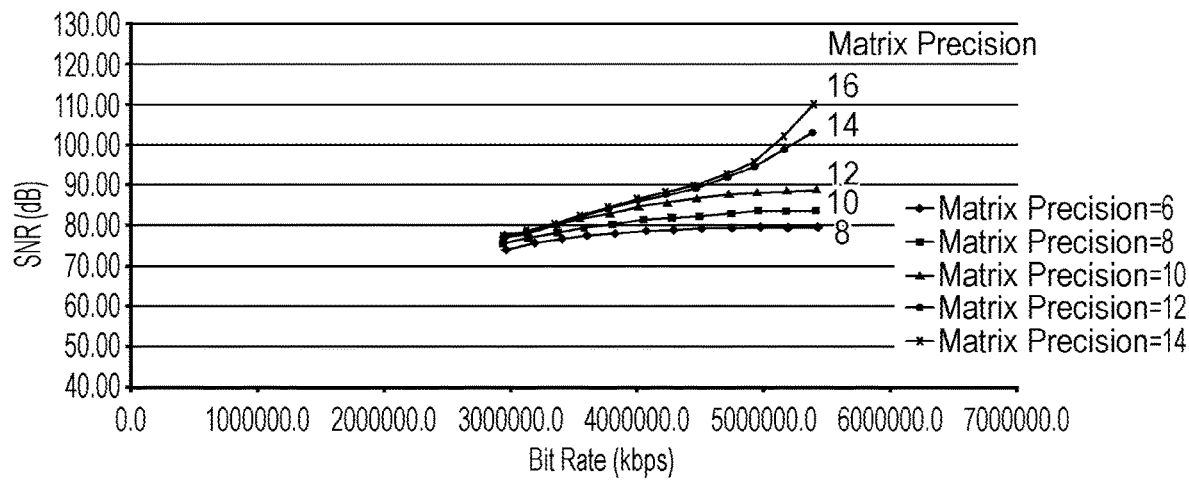
FIG. 26 is a graph of PSNR against bit rate for one test sequence comparing various precision DCT matrices.

The empirical results have shown that in embodiments of the present disclosure, the transform matrix precision should be at least bitDepth-2. FIG. 26 is a graph of PSNR against bit rate for the green channel of one test sequence with bitDepth=10 and MAX_TR_DYNAMIC_RANGE=17, comparing various precision DCT matrices.

In embodiments, MAX_TR_DYNAMIC_RANGE should be at least 5 (which is the minimum value of $\log_2(\text{size})$) more than bitDepth. Additional accuracy has been shown to further improve coding efficiency.

In embodiments, ENTROPY_CODING_DYNAMIC_RANGE should be at least 6 more than the bitDepth (1 for the "quantisation" factor applied by QPs less than (4−(6*(bitDepth−8))) plus 5 for the maximum value of $\log_2(\text{size})$). In other embodiments, where the clipping for the lowest QP values is not a concern, then the ENTROPY_CODING_DYNAMIC_RANGE should be at least 5 (the minimum value of $\log_2(\text{size})$) more than bitDepth.

For the 16-bit system, the transform matrix precision should be set to 14, MAX_TR_DYNAMIC_RANGE should be set to 21, and ENTROPY_CODING_DYNAMIC_RANGE should be set to 22. Since having more internal accuracy is rarely considered harmful, these parameters have also been tested at different bitDepths, producing results which demonstrate that, for the same number of bits, significantly higher SNRs are achievable, and that the increased-accuracy system has PSNR/MSE operating points that are suitable for bitDepths of up to 16.

If Range Extensions is intended to produce a single new profile for all bit depths, then the system described above is suitable. However, if different profiles are to be described for different maximum bitDepths, then having different parameter values may be useful for reducing hardware complexity in systems that do not require the highest profiles. In some embodiments, the different profiles may define different values for transform matrix precision, MAX_TR_DYNAMIC_RANGE and ENTROPY_CODING_DYNAMIC_RANGE.

In other embodiments, the profile would allow the values of some or all of transform matrix precision, MAX_TR_DYNAMIC_RANGE and ENTROPY_CODING_DYNAMIC_RANGE to be chosen from a list of permissible values by the encoder (with the cost of implementation being a selection criterion), or a function of side information such as the bitDepth. However, this may require multiple sets of transform matrices if the transform matrix precision is to be varied and for this reason, in further embodiments only one transform matrix precision is defined for a profile, with that transform matrix precision corresponding to the recommended value for the maximum bit depth for which the profile is designed. A set of possible profiles is proposed below with reference to FIG. 28.

Examples values of transform matrix precision, MAX_TR_DYNAMIC_RANGE, ENTROPY_CODING_DYNAMIC_RANGE and bitDepth are shown in the following table:

| bitDepth | 16 | 15 | 14 | 13 | 12 | 11 | 10 | 9 | 8 |
|---|---|---|---|---|---|---|---|---|---|
| Transform Matrix Precision | 14 | 13 | 12 | 11 | 10 | 9 | 8‡ | 7‡ | 6 |
| MAX_TR_DYNAMIC_RANGE | 21 | 20 | 19 | 18 | 17 | 16 | 15 | 15*15* | |
| ENTROPY_CODING_DYNAMIC_RANGE | 22 | 21 | 20 | 19 | 18 | 17 | 16† | 1515* | |

In the table, values marked with a '*' are clipped to a minimum of 15, in line with the current description of HEVC. The values marked with "†" and "‡" are greater than those specified for the current description of HEVC, those being 15 and 6 respectively.

If different profiles are to be used, then in embodiments of the disclosure these specifications may be used as minima (noting that the HEVC version 1 10-bit system does not quite meet these targets).). Using values less than these indicated minima is possible, although this will degrade the PSNR for higher bit rates (lower QPs).

Turning now to the CABAC system, as discussed above, in some embodiments the HEVC CABAC entropy coder codes syntax elements using the following processes:

The location of the last significant coefficient (in scan order) in the TU is coded.

For each 4×4 coefficient group (groups are processed in reverse scan order), a significant-coefficient-group flag is coded, indicating whether or not the group contains-non-zero coefficients. This is not required for the group containing the last significant coefficient and is assumed to be 1 for the top-left group (containing the DC coefficient). If the flag is 1, then the following syntax elements pertaining to the group are coded immediately following it; Significance map; Greater-than-one map; Greater-than-two flag; Sign bits; and Escape codes.

Figure 29:
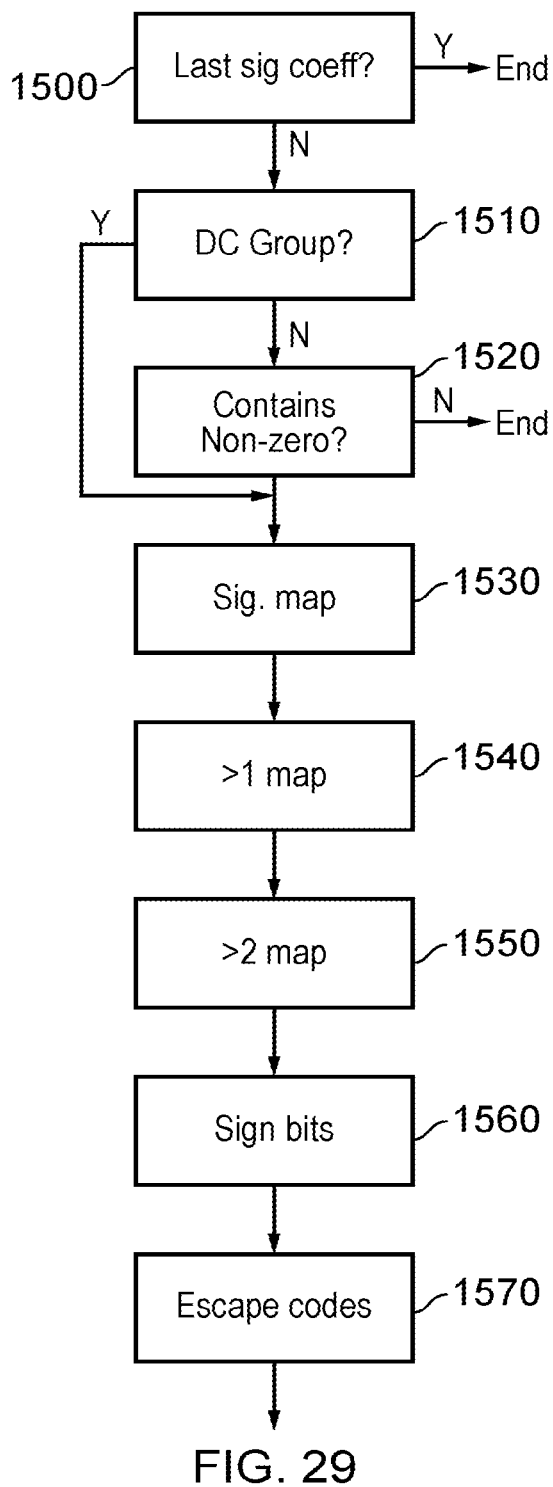
FIGS. 29 to 31 are schematic flowcharts respectively illustrating versions of part of a CABAC process.

This arrangement is illustrated schematically in FIG. 29. At a step 1500, the CABAC encoder checks whether a current group contains the last significant coefficient. If so, the process ends. If not, the process proceeds to a step 1510 at which the encoder checks whether the current group is the top-left group containing the DC coefficient. If so, control passes to a step 1530. If not, at a step 1520, the encoder detects whether the current group contains non-zero coefficients. If not, the process ends. If so, then at the step 1530 a significance map is generated. At a step 1540, a >1 map is generated which indicates, for up to 8 coefficients with significance map value 1, counted backwards from the end, of the group, whether the magnitude is greater than 1. At a step 1550, a >2 map is generated. For up to 1 coefficient with >1 map value of 1 (the one nearest the end of the group), this indicates whether the magnitude is greater than 2. At a step 1560, sign bits are generated and ante step 1570, escape codes are generated for any coefficient whose magnitude was not completely described by an earlier syntax element (that is to say, data generated in any of the steps 1530-1560).

For a 16-bit, 14-bit or even 12-bit system at the operating point where the MSE is less than 1 (typically at QPs −34, −22 and −10 respectively), the system typically yields very little compression (for 16-bit, it actually inflates the source data). The coefficients are generally large numbers, and therefore are almost always escape-coded. For that reason, two proposed changes have been made to the entropy coder to allow for higher bit depths by placing a fixed number of LSBs, $B_F$, in the bit stream for each coefficient. In essence the schemes permit the current HEVC CABAC entropy coder, which was developed for 8 and 10-bit operation, to operate at the original bitDepth for which it was designed, by effectively converting a higher-bit system, such as 16-bit, into a lower-bit system, such as 10-bit, with an alternative path for the additional accuracy. The effectiveness of the splitting method employed is aided since the lower-bit system values are significantly more predictable and therefore suitable for encoding with more complex encoding schemes, whereas the additional accuracy required by the higher-bit system is less predictable and therefore less compressible and complex encoding schemes are less effective. For example a 16-bit system could configure $B_F$ to be 8.

The use of the fixed bits schemes is indicated in the bit-stream by the encoder, and when a scheme is used, the means to determine the number of fixed bits would indicated by the encoder to the decoder. Those means would be either encoding the number directly, or indicating how to derive the value $B_F$ from parameters present in the bit-stream (including QP, bit depth, and/or profile) already coded in the bit-stream, or a combination thereof. The encoder would also have the option to indicate different $B_F$ values for different Pictures, Slices, and CUs, using the same means, or by indicating delta values to the $B_F$ value derived for the sequence, picture, slice or preceding CU. The value of $B_F$ may also be configured to be different for the different transform unit block sizes, the different prediction types (inter/intra), and different colour channel, where the nature of the source video would steer the encoder in choosing different parameters.

An example derivation for $B_F$ based on QP is as follows:

$$B_F = \max(0, \text{int}(QP/-6))$$

An example derivation for $B_F$ based on the bit depth is as follows:

$$B_F = \text{bitDepth} - 8$$

An example derivation for $B_F$ based on the transform unit block size and QP:

$$B_F = \max(0, \text{int}(QP/-6) + 2 - \log_2(\text{size}))$$

The various values of $B_F$ could be determined in an encoder using a pre-coder (trial) arrangement, or could be configured to follow pre-determined rules.

Entropy Coding Embodiment 1

To allow for processing at higher bit depths, the process of the HEVC entropy coder is changed to the following for a number of fixed bits $B_F$ less than bitDepth:

The location of the last significant coefficient (in scan order) in the TU is coded.

For each 4×4 coefficient group (groups are processed in reverse scan order), each coefficient C is split into a most-significant part $C_{MSB}$ and a least-significant part $C_{LSB}$, where $$C_{MSB} = \text{abs}(C) >> B_F$$

$$C_{LSB} = \text{abs}(C) - (C_{MSB} << B_F)$$

and $B_F$ is the number of fixed bits to use, as determined from the bit stream:

and a significant-coefficient-group flag is coded, indicating whether or not the group contains non-zero values of $C_{MSB}$. This is required for the group containing the last significant coefficient and is assumed to be 1 for the top-left group (containing the DC coefficient). If the flag is 1, then the following syntax elements pertaining to the group are coded immediately following it:

Significance Map:

For each coefficient in the group, a flag is coded indicating whether or not the value of $C_{MSB}$ is significant (has a non-zero value). The flag is coded for the coefficient indicated by the last-significant position.

Greater-than-One Map:

For up to eight coefficients with significance map value 1 (counted backwards from the end of the group), this indicates whether $C_{MSB}$ is greater than 1.

Greater-than-Two Flag:

For up to one coefficient with greater-than-one map value 1 (the one nearest the end of the group), this indicates whether $C_{MSB}$ is greater than 2.

Fixed Bits:

For each coefficient in the group, the value of $C_{LSB}$ is coded as bypass data using equiprobable CABAC bins.

Sign Bits:

For all non-zero coefficients, sign bits are coded as equiprobable CABAC bins, with the last sign bit (in reverse scan order) possibly being instead inferred from parity when sign bit hiding is used.

Escape Codes:

For any coefficient whose magnitude was not completely described by an earlier syntax element, the remainder is coded as an escape code.

However, where the significant-coefficient-group flag is a 0, then the following syntax elements pertaining to the group are coded immediately following it:

Fixed Bits:

For each coefficient in the group, the value of $C_{LSB}$ is coded equi-probable CABAC bins.

Sign Bits:

For all non-zero coefficients, sign bits are coded as equiprobable CABAC bins, with the last sign bit (in reverse scan order) possibly being instead inferred from parity when sign bit hiding is used.

An embodiment of this disclosure changes the interpretation of the significant coefficient group flag to indicate whether any of the coefficients are non-zero (not just their $C_{MSB}$ counterparts). In this case, the coefficient group containing the last coefficient in the reverse scan order would not need to be indicated (as it would be 1), and additional syntax elements would not needed to be coded when the significant-coefficient-group flag is a 0.

Figure 30:
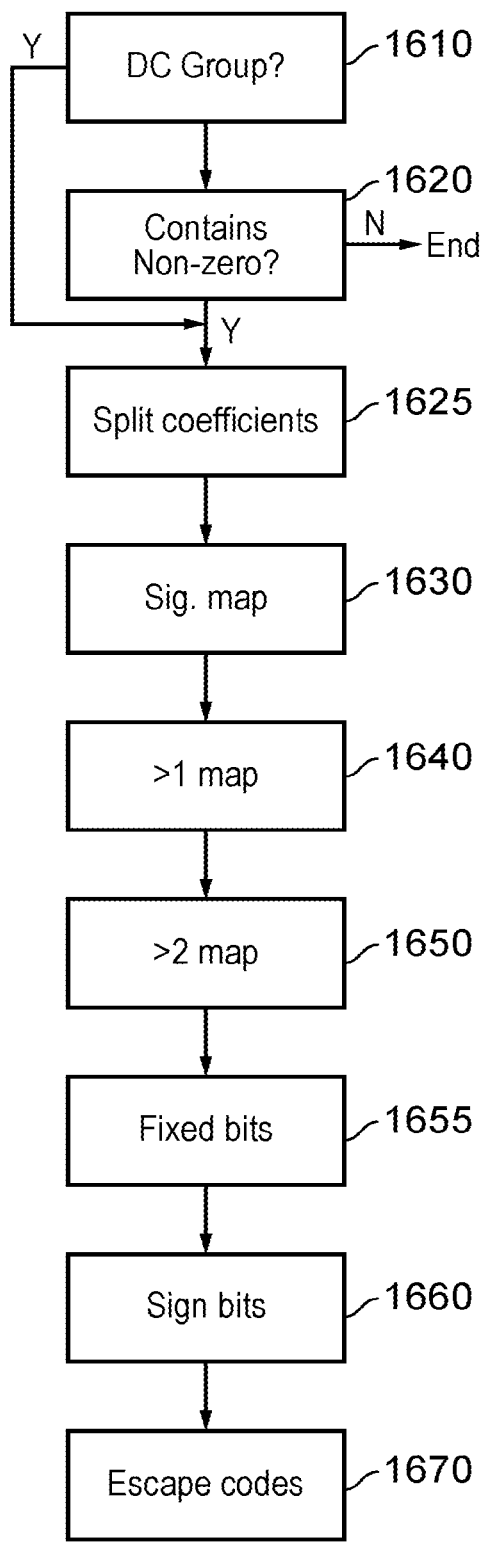

This latter arrangement is illustrated schematically in FIG. 30 which corresponds in many respects to FIG. 29. Comparing the two drawings, it will be seen that FIG. 30 has no equivalent of the step 1500 of FIG. 29, corresponding to the fact that the process takes place even for the group containing the last significant coefficient. Steps 1610 and 1620 generally correspond to the steps 1510 and 1520 of FIG. 29. At a newly introduced step 1625, the coefficients are split into MSB and LSB portions as discussed above. Steps 1630, 1640 and 1650 generally correspond to respective steps 1530, 1540 and 1550 of FIG. 29 except that they act only on the MSB portion of the split coefficients. A newly introduced step 1655 involves encoding the LSB portions of the split coefficients as fixed bits as discussed above. Steps 1660 and 1670 generally correspond to the steps 1560 and 1570 of FIG. 29.

This modification can effectively produce a system where the CABAC entropy coder is operating at the original bitDepth for which it was designed, by selecting $B_F$ so that a number of MSBs equal to the design bit depth of the encoder is passed through the CABAC encoding, with the higher bit depth's LSBs (which are the least predictable and therefore least compressible) being bypass-coded. For example, if the encoder is an 8 or 10 bit depth encoder, $B_F$ could equal 8 or 10.

The results for this proposal can be seen in FIG. 27, which is a graph of PSNR against QP for one test sequence with the DCT matrix precision and MAX_TR_DYNAMIC_RANGE set according to bit depth, showing equivalent operations with (the curve 1680) and without the curve 1690) bypass fixed-bit encoding. The saving in bit rate for the system with fixed bits (relative to the system without fixed bits) varies from 5% at QP 0 up to 37% at QP −48. The best value of $B_F$ will be sequence dependent. An example of $B_F$ is 8 or 10 as discussed above.

Entropy Coding Embodiment 2

A similar scheme under other embodiments applies many of the same processing steps, but retains the original functionality of the significance map—where a flag value of 0 indicates a coefficient value of 0 (rather than as in the Entropy Coding Embodiment 1—a value of 0 for the MSB portion of the coefficient). This may be more useful when considering (typically smooth) computer generated video (where zeros are expected to be more common). This Entropy Coding Embodiment comprises the following processing steps for a number of fixed bits $B_F$ less than bitDepth:

The location of the last significant coefficient (in scan order) in the TU is coded.

For each 4×4 coefficient group (groups are processed in reverse scan order), a significant-coefficient-group flag is coded, indicating whether or not the group contains non-zero coefficients. This is not required for the group containing the last significant coefficient and is assumed to be 1 for the top-left group (containing the DC coefficient). If the flag is 1, then each coefficient C is split into a most-significant part $C_{MSB}$ and a least-significant part $C_{LSB}$, where $$C_{MSB}=(\text{abs}(C)-1)>>B_F$$

and $$C_{LSB}=(\text{abs}(C)-1)-(C_{MSB}<<B_F)$$

and the following syntax elements pertaining to the group are coded immediately following it:

Significance Map:

For each coefficient in the group, a flag is coded indicating whether or not the coefficient C is significant (has a non-zero value). No flag is necessary for the coefficient indicated by the last-significant position.

Greater-than-One Map:

For up to eight coefficients with significance map value 1 (counted backwards from the end of the group), this indicates whether $C_{MSB}$ is greater than or equal to 1.

Greater-than-Two Flag:

For up to one coefficient with greater-than-one map value 1 (the one nearest the end of the group), this indicates whether $C_{MSB}$ is greater than or equal to 2.

Sign Bits:

For all non-zero coefficients, sign bits are coded as equiprobable CABAC bins, with the last sign bit (in reverse scan order) possibly being instead inferred from parity when sign bit hiding is used.

Fixed Bits:

For each non-zero coefficient in the group, the value of $C_{LSB}$ is coded.

Escape Codes:

For any coefficient whose magnitude was not completely described by an earlier syntax element, the remainder is coded as an escape code.

Figure 31:
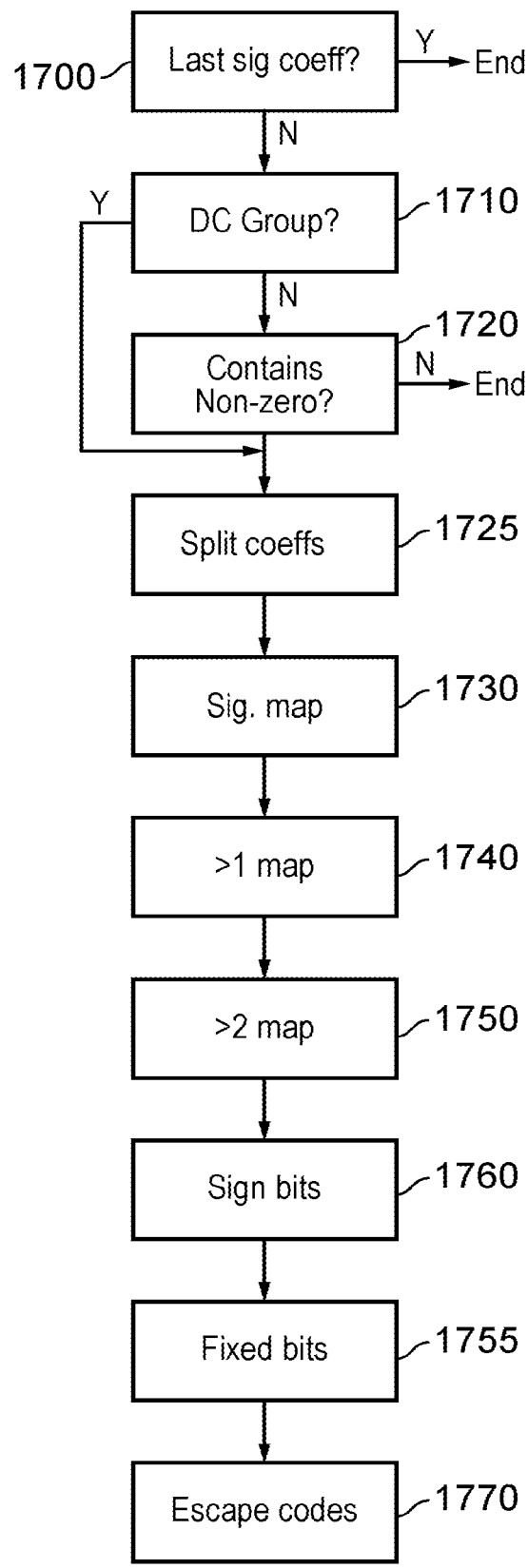

This arrangement is schematically illustrated in the flowchart of FIG. 31. Here, the steps 1700 . . . 1770 correspond to respective steps of FIGS. 31 and 32 in the following way, unless a difference is identified. Note that the step 1755 follows the step 1760 in FIG. 31 (the similar step 1655 preceded the step 1660 in FIG. 30).

The step 1700 corresponds generally to the step 1500 of FIG. 29. If this is not the group containing the last significant coefficient, control passes to the step 1710. The steps 1710 and 1720 correspond to the steps 1610 and 1620 of FIG. 30. The coefficients are split at the steps 1725 corresponding to the step 1625 of FIG. 30. However, at the steps 1730, in contrast to the arrangement of the step 1630 discussed earlier, the whole coefficient (ignoring, for the time being, the split executed in the step 1725) is used in the derivation of the significance map. The steps 1740 and 1750 act on only the MSB portions of the split coefficients and correspond in function to the steps 1640 and 1650. Apart from the fact that the ordering of the steps is illustrated (by way of example) slightly differently between FIGS. 32 and 33, the steps 1755, 1760 and 1770 correspond to the functionality of the steps 1655, 1660 and 1670.

Results comparing these two Entropy Coding Embodiments can be seen in FIG. 28. FIG. 28 is a graph illustrating, for each of six test sequences, a bit rate percentage improvement for the Entropy Coding Embodiment 2 relative to the results achieved (with otherwise identical parameters) for the Entropy Coding Embodiment 1.

The Entropy Coding Embodiment 2 has been shown to be 1% less efficient on average for some source material than the Entropy Coding Embodiment 1 for negative QPs, rising to approximately 3% for positive QPs. However, for some softer source material, the opposite is observed, due to the increased presence of zeros in the coefficients. In an embodiment, the encoder would be able to choose either entropy coding method and signal to the decoder the choice.

Since the saving for positive QPs is small compared to the saving for negative QPs, the entropy coding modifications could be enabled only when QP is negative. Considering that the Entropy Coding Embodiment 1 shows bit savings of up to 37% for negative QPs, there is little difference between the two Entropy Coding Embodiments at these operating points when compared to a system with no entropy coding modifications.

Since the quantity of data being coded is somewhat higher than observed for standard HEVC version 1 operating points, an additional stage applicable to both proposed systems, and indeed a system where the previously proposed systems cannot be or are not enabled will now be discussed in connection with further embodiments of the disclosure.

This additional stage causes the CABAC stream to be bit-aligned prior to coding the bypass data for each coefficient group. This allows quicker (and in-parallel) decoding of the bypass data, since the values can now be read directly out of the stream, removing the requirement for long-division when decoding bypass bins.

One mechanism to achieve this is to apply the CABAC termination method previously presented above.

However, in the embodiment now described, instead of terminating the bit-stream, the CABAC state is aligned to a bit boundary.

To bit-align the stream, m_Range is simply set to 256 in both the encoder and decoder. This significantly simplifies the encoding and decoding process, allowing the binary data to be read directly out of m_Value in raw form, and therefore many bits at a time can simultaneously be processed by the decoder. The value 256 may in some examples be considered as an example of a predetermined minimum value of the range variable m_Range.

Note that the act of setting m_Range to 256 incurs a loss of, on average, 0.5 bits (if m_Range was already 256, there is no loss; if m_Range was 510, then, approximately 1 bit will be lost; the average over all valid values of m_Range is therefore 0.5 bits).

Figure 33:
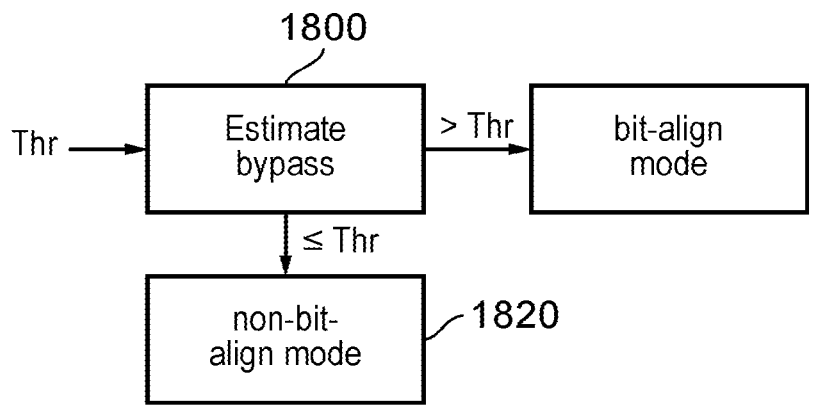
FIGS. 33 to 35 are schematic flowcharts respectively illustrating versions of a termination stage of a CABAC process.
Figure 34:
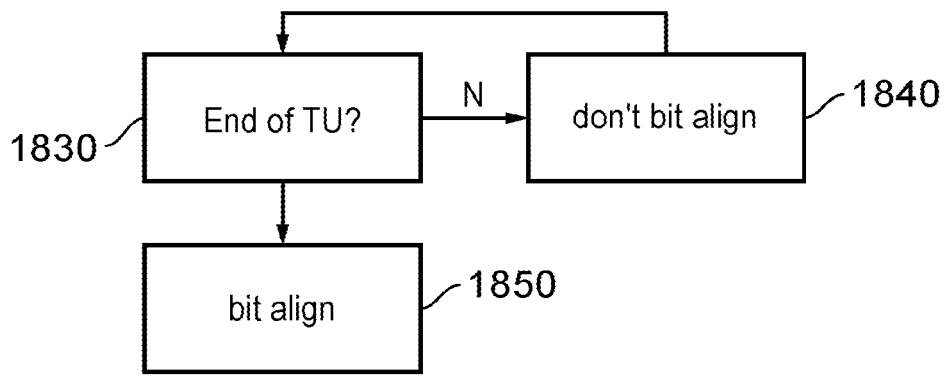
Figure 35:
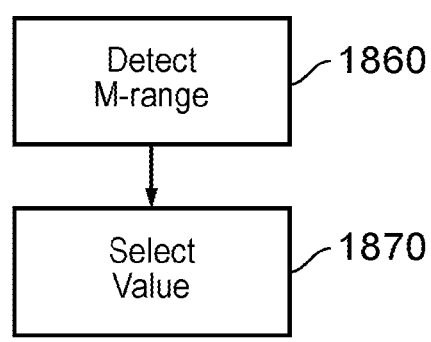

A number of methods can be used to mitigate the loss, or potential cost, incurred by these techniques. FIGS. 33 to 35 are schematic flowcharts respectively illustrating versions of a termination stage of a CABAC process as carried out by the CABAC encoder.

According to FIG. 33, whether or not to bit-align, could be selected depending on an estimate of the expected quantity of bypass-coded data (for example, based on the number of greater-than-one flags equal to 1) if few bypass-coded data are expected, bit-aligning is costly (as it wastes on average 0.5 bits per alignment), and also unnecessary since the bit-rate is likely to be lower. Accordingly, in FIG. 33, a step 1800 involves detecting the estimated quantity of bypass-encoded data by detecting the number of >1 flags which have been set, and comparing that number to a threshold value Thr. If the estimate exceeds the threshold Thr then control passes to a step 1810 at which the bit align mode is selected. Otherwise, control passes to a step 1820 at which the non-bit-align mode is selected. The steps of FIG. 34 can be repeated each sub-group in each TU, for example.

Referring to FIG. 34, rather than code bypass data at the end of each coefficient group, all the bypass data for a TU can be coded together after the CABAC bin data for the TU. The loss is therefore 0.5 bits per coded TU, rather than 0.5 bits per coefficient group. Accordingly, at a step 1830 in FIG. 34, a test is applied to detect whether the current group is at the end of encoding a TU. If not, then bit alignment is not applied (indicated schematically as a step 1840) and control returns to the step 1830. But if so, then bit alignment is applied at a step 1850.

This alignment mechanism may also be used prior to other or all data in the stream that are coded with a equi-probable mechanism, which although it may decrease the efficiency, may simplify the coding of the stream.

As an alternative alignment, referring to FIG. 35, m_range can be set to one of a number N of predetermined values rather than simply 258 (384, for example, would align to a half-bit). Since the aligning value must be less than or equal to the original value of m_Range (as range cannot be increased other than through renormalisation), the loss-per-alignment is then (0.5/N) for regularly spaced values. This method would still require division for values other than 256, but the denominator would be known in advance and so the division could be evaluated using a look-up table. Accordingly, at a step 1860 (which applies in a bit alignment situation) the value of m_range is detected, and at a step 1870 an aligned value is selected according to m_range for use in the bit alignment process.

As a further refinement to this alternative alignment method, the bin (or bins) immediately following the alignment can be coded using (unequal) symbol ranges that are powers of two. In this way, all requirements for division for subsequent bins can be removed without any further loss over (0.5/N) in bit efficiency.

For example, when aligning to 384, the symbol ranges for [0,1] for the subsequent bin can be [256,128]:

If a 0 is coded, m_Range is set to 256, making the cost to encode the bin 0.5 bits.

If a 1 is coded, m_Range is set to 128 (and 256 is added to m_Value) and the system is renormalised (again, m_Range becomes 256), making the cost to encode the bin 1.5 bits.

Since 0 and 1 are expected with equal probability, the average cost to encode the bin immediately following alignment is still 1 bit. For the case where N=2, and the two alignment points are 256 and 384, the method would be to pick the largest alignment point that is less than or equal to the current m_range. If that alignment point is 256, then m_Range is just set to 256 to align the CABAC engine; if the alignment point is 384, then the above process is required, which would require the coding of one symbol.

Figures 32A, 32B:
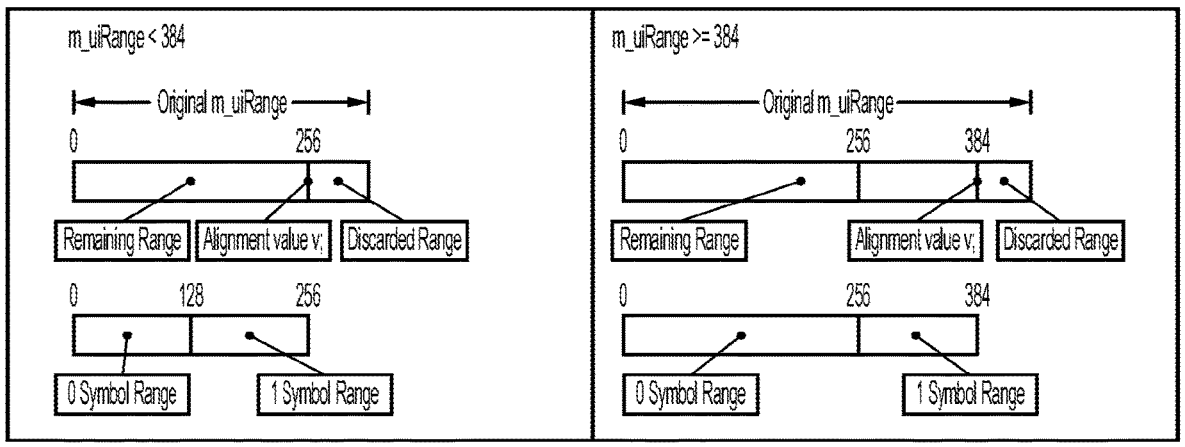
FIGS. 32A-F are schematic diagrams illustrating different CABAC alignment schemes.
Figures 32C, 32D:
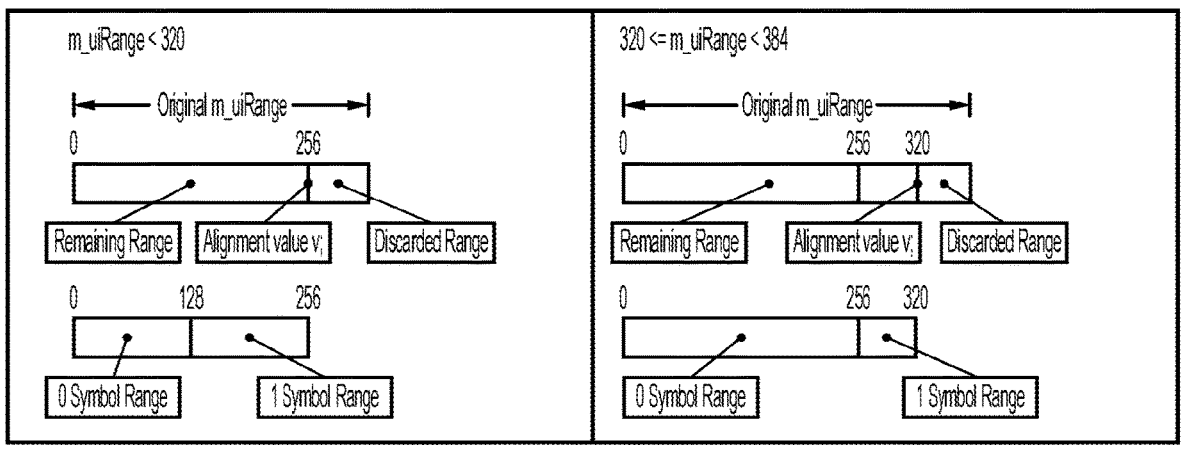
Figures 32E, 32F:
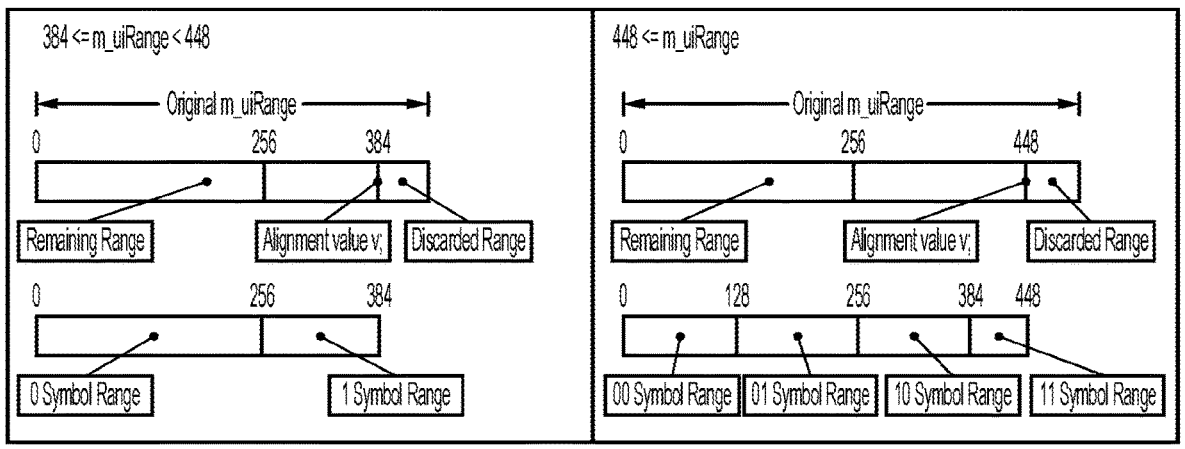

This is shown in FIGS. 32A and B, and a further example with N=4 is shown in FIGS. 32C to 32F.

To illustrate the advantages of aligning the CABAC engine, the method to decode an equiprobable (EP) bin without this alignment stage might be expressed as follows:

```
if ( m_Value>= m_Range/2 )
    the decoded EP value is a 1. Decrement m_Value by m_Range/2
else
    the decoded EP value is a 0.
then, read next bit from the bit-stream:
m_Value=(m_Value*2) + next_bit_in_stream
```

A worked example of this is then:

```
let m_Range=458 and m_Value=303 and the next
two bits in the bitstream are 1
    cycle 1:
        m_Value>= 229, so the next coded EP value is 1. m_Value = 74
        then, read next bit from the bit-stream: m_Value=74*2 + 1 = 149
    cycle 2:
        m_Value< 229, so the EP value is 0 (m_Value unchanged)
        then, read next bit from the bit-stream m_Value=
        149*2 + 1 = 299
```

The decoded equiprobable bins are equivalent to one stage of long division, and arithmetic would be required to test the inequality. To decode two bins, then this example process would be used twice, implementing a two-stage long division process.

However, if the alignment stage is applied, resulting in m_Range being the largest valid power of 2 (such as 256 for the 9-bit HEVC CABAC entropy coder), then the above process is simplified
  the coded EP value is the most significant bit of m_Value.
  Update m_Value, by treating it as a shift register, shifting in the next bit in the stream into the least significant position.

Hence, m_Value essentially becomes a shift register, and the EP bins are read from the most significant position, whilst the bit-stream is shifted into the least significant position. Therefore multiple EP bits can be read by simply shifting more bits off the top of m_Value.

A worked example of this aligned case is:

```
Let m_Range=256, m_Value=189 and the next two bits
in the bitstream are 1 cycle 1:
    Next coded EP value is bit 7 of m_Value, which is a 1.
    Update m_Value by shifting out bit 7, and shifting in 1
    from the bit stream into the least significant position:
    m_Value becomes 123.
cycle 2:
    Next coded EP value is bit 7 of m_Value, which is a 0.
    Update m_Value by shifting out bit 7, and shifting in
    1 from the bit stream into the least significant position:
    m_Value becomes 247.
```

The number of alignment points, N, that are selected can be seen as a trade-off between complexity of implementation and the bit-cost of alignment. For an operating point where there are many EP bins per alignment point, then the wastage is less significant, and an alignment system with fewer points may suffice. Conversely, for an operating point, where there are fewer EP bins per alignment point, then the wastage is more significant, and an alignment system with more points may be preferable; for some operating points disabling the alignment algorithm entirely may be preferable. The encoder, and therefore bit-stream, could indicate the number of alignment points that are to be used by the decoder, which may be chosen according to the operating point for that section of the data stream. This number indicated may alternatively be inferred from other information present in the bit-stream, such as a profile or level.

Using multiple alignment positions, in a simple case, where the alignment positions are just 256 and 384:

```
To align,
    if m_Range < 384, just set m_Range=256, and see
        above worked example for decoding.
    else
        set m_Range=384, and the following process is
        used for coding the next EP bin:
    m_Range=384=256+128,
    Assign the symbol range of 256 to the value of 0
    and 128 to the value of 1 for the next EP bin to
    be coded.
    If m_Value >= 256, then      (a MSB bit test operation)
        the next EP value is a 1.
        m_Value-=256      (actually is a bit-clear operation)
        m_Range=128.
        Renormalise (because m_Range<256):
        m_Range=256
        m_Value=(m_Values*2) + next_bit_in_stream
    else
        the next EP value is a 0.
        m_Range=256.
    Then, m_Range=256, and the above simple process
    can be used for all subsequent EP bins.
```

The results for Entropy Coding Embodiment 1 with the CABAC bit-alignment mechanisms just discussed are shown in FIG. 29, which is a graph of bit rate, difference against QP for six sequences with and without the bit alignment mechanisms for N=1. A positive bit rate difference (on the vertical axis) indicates that the system with bit alignment generates a higher bit rate than the scheme without the bit alignment bit alignment mechanism. The bit rate difference for each sequence is approximately 0.5 times the number of thousand coefficient groups per second (Traffic is 2560×1600 30 p=11520, all others are 1920×1080 50 p=9720).

The options set out in FIG. 30 are proposed as profiles.

If the High profile(s) are only required to support bit-Depths of up to 14, then the transform matrix coefficient precision, MAX_TR_DYNAMIC_RANGE and ENTROPY_CODING_DYNAMIC_RANGE are proposed to be set, to 12, 19 and 20 respectively.

In addition to these profiles, intra-only Main/Extended profiles could be defined, but since an intra-only decoder is significantly less complex than an intra/inter decoder, only a High intra profile has been described here.

In a similar vein, Extended/High profiles for coding still pictures in various chroma formats could be defined.

Lower profiles could need to use the same matrix Precision, MAX_TR_DYNAMIC_RANGE and ENTROP_CODING_DYNAMIC_RANGE as used by the higher profiles else the bit-streams produced by the two Profiles would not match.

Various options will now be discussed.
Option 1

| High | Bit Depth | 16 | 15 | 14 | 13 | 12 | 11 | 10 | ... |
|---|---|---|---|---|---|---|---|---|---|
| 4:4:4 | Transform Matrix Precision | 14 | 13 | 12 | 11 | 10 | 9 | 8 | ... |
| | MAX_TR_DYNAMIC_RANGE | 21 | 20 | 19 | 18 | 17 | 16 | 15 | ... |
| | ENTROPY_CODING_DYNAMIC_RANGE | 22 | 21 | 20 | 19 | 18 | 17 | 16 | ... |

-continued

| | | | | | | | | | | |
|---|---|---|---|---|---|---|---|---|---|---|
| Extended 4:4:4 | Bit Depth | — | — | — | — | 12 | 11 | 10 | ... |
| | Transform Matrix Precision | — | — | — | — | 10 | 9 | 8 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

In this option, the bit depth will dictate the transform matrix precision, MAX_TR_DYNAMIC_RANGE and ENTROPY_CODING_DYNAMIC_RANGE. This means that a decoder that would need to support bit depths up to 16 would need to process 13 bit data with a different set of matrices, and the internal accuracy would be limited to just 18 bits for MAX_TR_DYNAMIC_RANGE, although the decoder would have, the ability to support up to 21. However, 12 bit data encoded using the high profile could be decoded by a decoder compliant at a lower profile.

Option 2

| | | | | | | | | | | |
|---|---|---|---|---|---|---|---|---|---|---|
| High 4:4:4 | Bit Depth | 16 | 15 | 14 | 13 | 12 | 11 | 10 | ... |
| | Transform Matrix Precision | 14 | 14 | 14 | 14 | 10 | 10 | 10 | ... |
| | MAX_TR_DYNAMIC_RANGE | 21 | 21 | 21 | 21 | 17 | 17 | 17 | ... |
| | ENTROPY_CODING_DYNAMIC_RANGE | 22 | 22 | 22 | 22 | 18 | 18 | 18 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... |

In this option, the bit parameters for the overlapping bit depths are determined by the lower, profile, thereby making decoding 12-bit data encoded using the high profile decodable using a decoder compliant to the extended profile. In addition, the internal accuracy of 13 bit data would be the same as for the 16 bit data. In addition, few matrix precisions would need to be supported than in Option 1.

In the present context, a single set of transform matrix values could be stored, and all other values derived from this.

Note that if the transform matrices have an initial precision of 14 bits, generally the lower precisions could be derived by divide by two and rounding.

Using this general rule to derive the lower-precision matrices from higher precision matrices would lead to:

Example 1

| | | |
|---|---|---|
| Option 1: | High 4:4:4 | Define transform matrix precision = 14 Derive transform matrix precision = 13 ... from 14 |
| | Ext 4:4:4 | Define transform matrix precision = 14 Derive transform matrix precision = 10 ... from 14 | i.e. Store at "High" precision.

Example 2

| | | |
|---|---|---|
| Option 1: | High 4:4:4 | Define transform matrix precision = 10 Derive transform matrix precision = 14 ... from 10 |
| | Ext 4:4:4 | Define transform matrix precision = 10 Derive transform matrix precision = 10 ... from 14 | i.e. Store at "Extended" precision.

For better quality "Example 1" is preferred. However Example 2 can lead to reduced storage requirements.

Note—An alternative is of course to store a transform matrix set for each precision. "Example 1" and "Example 2" rules can also be used for "Option 2".

As an aim is to increase quality and also split into profiles, there will be scaling errors if each transform matrix set is derived from a single set at one precision.

In the case of "Example 1" the system is down-scaling the transform matrices from 14 bits, and in the case of "Example 2" the system is up-scaling and down-scaling the transform matrices from 10 bits.

Option 3

| | | | | | | | | | | |
|---|---|---|---|---|---|---|---|---|---|---|
| High 4:4:4 | Bit Depth | 16 | 15 | 14 | 13 | 12 | 11 | 10 | ... |
| | Transform Matrix Precision | 14 | 14 | 14 | 14 | 14 | 14 | 14 | ... |
| | MAX_TR_DYNAMIC_RANGE | 21 | 21 | 21 | 21 | 21 | 21 | 21 | ... |
| | ENTROPY_CODING_DYNAMIC_RANGE | 22 | 22 | 22 | 22 | 22 | 22 | 22 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... | i.e. Bit Depths of 12 bit Video can be encoded either as "High 4:4:4" or "Ext 4:4:4", although only a high 4:4:4 decoder would be able to decode streams encoded using the high 4:4:4 scheme.
Option 4

| High 4:4:4 | Bit Depth | 16 | 15 | 14 | 13 | 12 | 11 | 10 | ... |
|---|---|---|---|---|---|---|---|---|---|
| | Transform Matrix Precision | 14 | 14 | 14 | 14 | — | — | — | ... |
| | MAX_TR_DYNAMIC_RANGE | 21 | 21 | 21 | 21 | — | — | — | ... |
| | ENTROPY_CODING_DYNAMIC_RANGE | 22 | 22 | 22 | 22 | — | — | — | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... | i.e. "High 4:4:4" Profile has to support the lower "Ext 4:4:4 Profile", with this "Option 4" there is only one choice on how to code 12-bit video.
Option 5

| High 4:4:4 | Bit Depth | 16 | 15 | 14 | 13 | 12 | 11 | 10 | ... |
|---|---|---|---|---|---|---|---|---|---|
| | Transform Matrix Precision | 14 | 14 | 14 | 14 | 14 | 14 | 14 | ... |
| | MAX_TR_DYNAMIC_RANGE | 21 | 20 | 19 | 18 | 17 | 16 | 15 | ... |
| | ENTROPY_CODING_DYNAMIC_RANGE | 22 | 21 | 20 | 19 | 18 | 17 | 16 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

In this option, the matrix precisions are limited to just 1 value per profile, reducing the overhead for an encoder. In addition, MAX_TR_DYNAMIC_RANGE and ENTROPY_CODING_DYNAMIC_RANGE are dictated by the bit depth, and therefore an encoder that only requires coding 13 bit data would not need to include the implementation overhead of using additional internal calculation accuracy.
Option 6

| High 4:4:4 | Bit Depth | 16 | 15 | 14 | 13 | — | — | — | ... |
|---|---|---|---|---|---|---|---|---|---|
| | Transform Matrix Precision | 14 | 14 | 14 | 14 | — | — | — | ... |
| | MAX_TR_DYNAMIC_RANGE | 21 | 20 | 19 | 18 | — | — | — | ... |
| | ENTROPY_CODING_DYNAMIC_RANGE | 22 | 21 | 20 | 19 | — | — | — | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

Option 6 is similar to Option 5, but where only the extended profiles are defined for coding 12 bit data.

In summary, the proposed changes according to various embodiments of the present disclosure are:

Use at least one additional transform matrix set for higher accuracy.

It is preferable to have a single set for all higher accuracies, to simplify multi-profile encoders/decoders.

Proposed transform matrices are provided for transform matrix precisions 7 to 14—see the description below.

It is suggested to use the 14-bit accuracy transform matrices as these will fit within 16-bit data types for software, and will provide sufficient accuracy to allow future extension to 16-bit video.

The choice of transform matrix precision could be configured by the bit depth of the input data and the profile, or alternately determined by parameters specified at the sequence, picture or slice level.

MAX_TR_DYNAMIC_RANGE and ENTROPY_CODING_DYNAMIC_RANGE can be changed for higher accuracy.

Multiple values of MAX_TR_DYNAMIC_RANGE and ENTROPY_CODING_DYNAMIC_RANGE should not present a problem for multi-profile encoders/decoders.

It is, suggested to derive MAX_TR_DYNAMIC_RANGE=bitDepth+5 and ENTROPY_CODING_DYNAMIC_RANGE=bitDepth+6.

As with the transform matrix precision, the choice of MAX_TR_DYNAMIC_RANGE and ENTROPY_CODING_DYNAMIC_RANGE could be configured by the bit depth of the input data and the profile, or alternately determined by parameters specified at the sequence, picture or slice level (possibly the same parameters as those that select the DCT matrices).

The entropy coding can be changed to include some fixed-bit processing (see Entropy Coding Embodiments 1 and 2) to increase compression at low QPs.

The presence of fixed bits could be configured at the sequence level.

The number of fixed bits $B_F$ could be configured at the sequence, picture (although this is difficult since the picture parameter set does not know of sequence level settings), slice or CU level (possibly by signalling a delta from the number of fixed bits for the previous sequence/picture/slice/CU, parent entity or profile definition).

The entropy coding can be changed to include CABAC bit-alignment to allow bypass bits to be extracted from the stream without the use of long division (it may also be preferable to apply one or more of the aforementioned bit-loss mitigation methods).

Embodiments of the present disclosure therefore provide that internal accuracies be increased to accommodate the requirement in the Range Extensions mandate to allow for higher bit depths through HEVC. The various sources of error have been studied and recommendations have been made. In addition, changes to improve coding efficiency have been presented, and changes to improve throughput have also been presented.

Increased-Precision Transform Matrices

This part of the description details the transform matrices at various levels of precision.

4×4 DST

The transform matrix is of the form:

$$\begin{vmatrix} a & b & c & d \\ c & c & e & -c \\ d & -a & -c & b \\ b & -d & c & -a \end{vmatrix}$$

where the values in the grid are defined by the matrix coefficient precision according to the following table (6-bit HEVC version 1 matrix values included for comparison):

|   | 6-bit | 7-bit | 8-bit | 9-bit | 10-bit | 11-bit | 12-bit | 13-bit | 14-bit |
|---|-------|-------|-------|-------|--------|--------|--------|--------|--------|
| a | 29 | 58 | 117 | 233 | 467 | 934 | 1868 | 3736 | 7472 |
| b | 54 | 110 | 219 | 439 | 878 | 1755 | 3510 | 7021 | 14042 |
| c | 73 | 148 | 296 | 591 | 1182 | 2365 | 4730 | 9459 | 18919 |
| d | 83 | 168 | 336 | 672 | 1345 | 2689 | 5378 | 10757 | 21513 |
| e | 0 | 0 | 0 | 0 | 0 | 0 | 0 | 0 | 0 |

Combined DCT Matrix

For ease of implementation, a single 32×32 DCT matrix $M_{32}$ can be described, from which each smaller N×N DCT matrix $M_N$ is derived through subsampling according to the following:

$$M_N[x][y]=M_{32}[x][2^{(5-log2(N))}y] \text{ for } x,y=0 \ldots (N-1).$$

The combined matrix $M_{32}$ is of the form:

with the values in the grid defined by the matrix coefficient precision according to the following table (6-bit HEVC version 1 matrix values included for comparison):

|   | 6-bit | 7-bit | 8-bit | 9-bit | 10-bit | 11-bit | 12-bit | 13-bit | 14-bit |
|---|---|---|---|---|---|---|---|---|---|
| a | 64 | 128 | 256 | 512 | 1024 | 2048 | 4096 | 8192 | 16384 |
| b | 83 | 167 | 334 | 669 | 1338 | 2676 | 5352 | 10703 | 21407 |
| c | 36 | 69 | 139 | 277 | 554 | 1108 | 2217 | 4433 | 8867 |
| d | 89 | 178 | 355 | 710 | 1420 | 2841 | 5681 | 11363 | 22725 |
| e | 75 | 151 | 301 | 602 | 1204 | 2408 | 4816 | 9633 | 19266 |
| f | 50 | 101 | 201 | 402 | 805 | 1609 | 3218 | 6436 | 12873 |
| g | 18 | 35 | 71 | 141 | 283 | 565 | 1130 | 2260 | 4520 |
| h | 90 | 180 | 360 | 721 | 1441 | 2882 | 5765 | 11529 | 23059 |
| i | 87 | 173 | 346 | 693 | 1386 | 2772 | 5543 | 11086 | 22173 |
| j | 80 | 160 | 319 | 639 | 1277 | 2554 | 5109 | 10217 | 20435 |
| k | 70 | 140 | 280 | 560 | 1119 | 2239 | 4478 | 8956 | 17911 |
| l | 57 | 115 | 230 | 459 | 919 | 1837 | 3675 | 7350 | 14699 |
| m | 43 | 85 | 171 | 341 | 683 | 1365 | 2731 | 5461 | 10922 |
| n | 25 | 53 | 105 | 210 | 420 | 841 | 1682 | 3363 | 6726 |
| o | 9 | 18 | 35 | 71 | 142 | 284 | 568 | 1136 | 2271 |
| p | 90 | 181 | 362 | 723 | 1446 | 2893 | 5786 | 11571 | 23143 |
| q | 90 | 179 | 358 | 716 | 1432 | 2865 | 5730 | 11460 | 22920 |
| r | 88 | 176 | 351 | 702 | 1405 | 2810 | 5619 | 11238 | 22476 |
| s | 85 | 170 | 341 | 682 | 1364 | 2727 | 5454 | 10908 | 21816 |
| t | 82 | 164 | 327 | 655 | 1309 | 2618 | 5236 | 10473 | 20946 |
| u | 78 | 155 | 311 | 621 | 1242 | 2484 | 4968 | 9937 | 19874 |
| v | 73 | 145 | 291 | 582 | 1163 | 2326 | 4653 | 9305 | 18611 |
| w | 67 | 134 | 268 | 537 | 1073 | 2146 | 4292 | 8584 | 17168 |
| x | 61 | 122 | 243 | 486 | 973 | 1945 | 3890 | 7780 | 15560 |
| y | 54 | 108 | 216 | 431 | 863 | 1725 | 3451 | 6901 | 13803 |
| z | 46 | 93 | 186 | 372 | 745 | 1489 | 2978 | 5956 | 11912 |
| A | 38 | 77 | 155 | 310 | 619 | 1238 | 2477 | 4953 | 9907 |
| B | 31 | 61 | 122 | 244 | 488 | 976 | 1951 | 3903 | 7806 |
| C | 22 | 44 | 88 | 176 | 352 | 704 | 1407 | 2815 | 5630 |
| D | 13 | 27 | 53 | 106 | 212 | 425 | 850 | 1700 | 3400 |
| E | 4 | 9 | 18 | 36 | 71 | 142 | 284 | 568 | 1137 |

For information, the smaller DCT matrices derived from the 32×32 matrix are presented here. The values in each grid are defined by the matrix coefficient precision according to the above table.

4×4 DCT

The matrix $M_4$ is defined as the first 4 coefficients of every $8^{th}$ row of the combined matrix $M_{32}$.

$$\begin{vmatrix} a & a & a & a \\ b & c & -c & -b \\ a & -a & -a & a \\ c & -b & b & -c \end{vmatrix}$$

8×8 DCT

The matrix $M_8$ is defined as the first 8 coefficient of every $4^{th}$ row of the combined matrix $M_{32}$.

$$\begin{vmatrix} a & a & a & a & a & a & a & a \\ d & e & f & g & -g & -f & -e & -d \\ b & c & -c & -b & -b & -c & c & b \\ e & -g & -d & -f & f & d & g & -e \\ a & -a & -a & a & a & -a & -a & a \\ f & -d & g & e & -e & -g & d & -f \\ c & -b & b & -c & -c & b & -b & c \\ g & -f & e & -d & d & -e & f & -g \end{vmatrix}$$

16×16 DCT

The matrix $M_{16}$ is defined as the first 16 coefficients of every even row of the combined matrix $M_{32}$.

$$\begin{vmatrix} a & a & a & a & a & a & a & a & a & a & a & a & a & a & a & a \\ h & i & j & k & l & m & n & o & -o & -n & -m & -l & -k & -j & -i & -h \\ d & e & f & g & -g & -f & -e & -d & -d & -e & -f & -g & g & f & e & d \\ i & l & o & -m & -j & -h & -k & -n & n & k & h & j & m & -o & -l & -i \\ b & c & -c & -b & -b & -c & c & b & b & c & -c & -b & -b & -c & c & b \\ j & o & -k & -i & -n & l & h & m & -m & -h & -l & n & i & k & -o & -j \\ e & -g & -d & -f & f & d & g & -e & -e & g & d & f & -f & -d & -g & e \\ k & -m & -i & o & h & n & -j & -l & l & j & -n & -h & -o & i & m & -k \\ a & -a & -a & a & a & -a & -a & a & a & -a & -a & a & a & -a & -a & a \\ l & -j & -n & h & -o & -i & m & k & -k & -m & i & o & -h & n & j & -l \\ f & -d & g & e & -e & -g & d & -f & -f & d & -g & -e & e & g & -d & f \\ m & -h & l & n & -i & k & o & -j & j & -o & -k & i & -n & -l & h & -m \\ c & -b & b & -c & -c & b & -b & c & c & -b & b & -c & -c & b & -b & c \\ n & -k & h & -j & m & o & -l & i & -i & l & -o & -m & j & -h & k & -n \\ g & -f & e & -d & d & -e & f & -g & -g & f & -e & d & -d & e & -f & g \\ o & -n & m & -l & k & -j & i & -h & h & -i & j & -k & l & -m & n & -o \end{vmatrix}$$

Embodiments as discussed above are defined by the following numbered clauses:

1. A data encoding method for encoding, a sequence of data values, the method comprising the steps of:

generating, from the input data values, respective complementary most-significant data portions and least-significant data portions, such that the most-significant data portion of a value represents a plurality of most significant bits of that value, and the respective least-significant data portion represents the remaining least significant bits of that value;

generating one or more data sets indicative of positions, relative to the array of the values, of most-significant data portions of predetermined magnitudes;

encoding the data sets to an output data stream using binary encoding; and including data defining the less-significant portions in the output data stream.

2. A method according to clause 1, in which one of the data sets is a significance map indicative of positions, relative to an array of the data values, of most-significant data portions which are non-zero.

3. A method according to clause 2, in which, the significance map comprises a data flag indicative of the position, according to a predetermined ordering of the array of values, of the last of the most-significant data portions having a non-zero value.

4. A method according to clause 2 or clause 3, in which the data sets comprise:

a greater-than-one map indicative of positions, relative to the array of the values, of most-significant data portions which are, greater than 1; and a greater-than-two map indicative of positions, relative to the array of the values, of most-significant data portions which are greater than 2.

5. A method according to clause 1, in which the data sets comprise:

a greater-than-one map indicative of positions, relative to an array of the values, of most-significant data portions which are greater than or equal to 1; and a greater-than-two map indicative of positions, relative to the array of the values, of most-significant data portions which are greater than or equal to 2.

6. A method according to clause 5, comprising the step of generating a further data set, the further data set being a significance map indicative of positions, relative to the array of the values, of non-zero values.

7. A method according to clause 6, in which the significance map comprises a data flag indicative of the position, according to a predetermined ordering of the array of values, of the last of the values having a non-zero value.

8. A method according to any one of the preceding clauses, in which the step of including data defining the less-significant data portions in the output data stream comprises encoding the least-significant data portions using arithmetic coding in which symbols representing the least-significant data portions are encoded according to respective proportions of a coding value range, in which the respective proportions of the coding value range for each of the symbols that describe the least-significant data portion are of equal size.

9. A method according to any one clauses 1 to 7, in which the step of including data defining the less-significant portions in the output data stream comprises directly including the least-significant data portions in the output data stream as raw data.

10. A method according to any one of the preceding clauses, in which:

the sequence of data values represent image data having an image data bit depth; and the method comprises setting the number of bits to be used as the plurality of most significant bits in each most-significant data portion to be equal to the image data bit depth.

11. A method according to any one of the preceding clauses, in which the sequence of data values comprises a sequence of frequency transformed image coefficients.

12. A method according to clause 11, in which the frequency-transformed input image coefficients are quantised frequency-transformed input image coefficients according to a variable quantisation parameter selected from a range of available quantisation parameters, the method comprising:

encoding the array of frequency-transformed input image coefficients according to the most-significant data portions and the least-significant data portions for coefficients produced using a quantisation parameter in a first predetermined sub-range of the range of available quantisation parameters; and for coefficients produced using a quantisation parameter not in the first predetermined sub-range of the range of available quantisation parameters, encoding the array of frequency-transformed input image coefficients such that the number of bits in each most-significant data portion equals the number of bits of that coefficient and the respective least-significant data portion contains no bits.

13. A method according to clause 11 or clause 12, comprising the steps of:

frequency-transforming input image data to generate an array of frequency-transformed input image coefficients by a matrix-multiplication process, according to a maximum dynamic range of the transformed data and using transform matrices having a data precision; and selecting the maximum dynamic range and the data precision of the transform matrices according to the bit depth of the input image data.

14. A method according to clause 13, in which the selecting step comprises:

setting the data precision of the transform matrices to a first offset number of bits less than the bit depth of the input image data; and setting the maximum dynamic range of the transformed data to a second offset number of bits greater than the bit depth of the input image data.

15. A method according to clause 14, in which the first offset number of bits is equal to 2 and the second offset number of bits is equal to 5.

16. A method according to any one of clauses 13 to 15, comprising the step of:

deriving transform matrices at a required data precision from respective source transform matrices at a different data precision.

17. A method according to any one of the preceding clauses, in which the encoding step comprises:

selecting one of a plurality of complementary sub-ranges of a set of code values according to the value of a current input data value of a data set for encoding, the set of code values being defined by a range variable;

assigning the current input data value to a code value within the selected sub-range;

modifying the set of code values in dependence upon the assigned code value and the size of the selected sub-range;

detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and after encoding a group of input data values, setting the range variable to a value selected from a predetermined subset of available range variable values, each value in the subset having at least one least significant bit equal to zero.

18. A method according to clause 17, in which:

the proportions of the sub-ranges relative to the set of code values are defined by a context variable associated with the input data value.

19. A method according to clause 18, comprising the step of:

following the coding of a data value, modifying the context variable, for use in respect of a next input data value, so as to increase the proportion of the set of code values in the sub-range that was selected for the current data value.

20. A method according to any one of clauses 17 to 19, in which:

the set of code values comprises values from 0 to an upper value defined by the range variable, the upper value being between 256 and 510.

21. A method according to clause 20, in which:

the subset of available values of the range variable comprises the value 256.

22. A method according to clause 20, in which:

the subset of available values comprises a set consisting of 256 and 384;

the step of setting the range variable comprises selecting a value from the subset according to a current value of the range variable, so that the range variable is set to 256 if the current value of the range variable is between 256 and 383, and the range variable is set to 384 if the current value of the range variable is between 384 and 510.

23. A method according to clause 20, in which:

the subset of available values comprises a set consisting of 256, 320, 384 and 448;

the step of setting the range variable comprises selecting a value from the subset according to a current value of the range variable, so that the range variable is set to 256 if the current value of the range variable is between 256 and 319, the range variable is set to 320 if the current value of the range variable is between 320 and 383, the range variable is set to 384 if the current value of the range variable is between 384 and 447, and the range variable is set to 448 if the current value of the range variable is between 448 and 510.

24. A method according to any one of clauses 17 to 23, comprising:

encoding data representing values which are not represented in a data set as bypass data;

detecting the quantity of bypass data associated with a current array; and applying the setting step if the quantity of bypass data exceeds a threshold amount, but not applying the setting step otherwise.

25. A method according to any one of clauses 17 to 24, in which the data are encoded as transform units comprising a plurality of arrays of data values, the method comprising applying the setting step at the end of encoding a transform unit.

26. A method of encoding image data, comprising the steps of:

frequency-transforming input image data to generate an array of frequency-transformed input image coefficients by a matrix-multiplication process, according to a maximum dynamic range of the transformed data and using transform matrices having a data precision; and selecting the maximum dynamic range and the data precision of the transform matrices according to the bit depth of the input image data.

27. Image data encoded by the encoding method of any one of the preceding clauses.

28. A data carrier storing video data according to clause 17.

29. A data decoding method for decoding data to provide an array of data values, the method comprising the steps of:

separating, from an input datastream, least-significant data portions of the data values and one or more encoded data sets;

decoding the data sets to generate most-significant data portions of the data values using binary decoding; and combining the most-significant data portions and the least-significant data portions to form the data values, such that, for a data value, the respective most-significant data portion represent a plurality of most significant bits of that data value, and the respective least-significant data portion represents the remaining least significant bits of that data value.

30. A method of decoding image data, comprising the steps of:

frequency-transforming input frequency-transformed image data to generate array of output image data by a matrix-multiplication process, according to a maximum dynamic range of the transformed data and using transform matrices having a data, precision; and selecting the maximum dynamic range and the data precision of the transform matrices according to the bit depth of the output image data.

31. Computer software which, when executed by a computer, causes the computer to carry out the method of any one of the preceding clauses.

32. A non-transitory machine-readable storage medium on which computer software according to clause 31 is stored.

33. Data encoding apparatus for encoding a sequence of data values, the apparatus comprising:

a generator configured to generate, from the input data values, respective complementary most-significant data portions and least-significant data portions, such that the most-significant data portion of a value represents a plurality of most significant bits of that value, and the respective least-significant data portion represents the remaining least significant bits of that value and configured to generate one or more data sets indicative of positions, relative to the array of the values, of most-significant data portions of predetermined magnitudes; and an encoder configured to encoding the data sets to an output data stream using binary encoding and to include data defining the less-significant portions in the output data stream.

34. Data encoding apparatus for encoding image data, the apparatus comprising:

a frequency transformer configured to frequency-transform input image data to generate an array of frequency-transformed input image coefficients by a matrix-multiplication process, according to a maximum dynamic range of the transformed data and using transform matrices having a data precision; and a selector configured to select the maximum dynamic range and the data precision, of the transform matrices according to the bit depth of the input image data.

35. Data decoding apparatus for decoding data to provide an array of data values, the apparatus comprising the steps of:
 a data separator configured to separate, from an input data stream, least-significant data portions of the data values and one or more encoded data sets;
 a decoder configured to decode the data sets to generate roost-significant data portions of the data values using binary decoding; and
 a combiner configured to combine the most-significant data portions and the least-significant data portions to form the data values, such t or a data value, the respective most-significant data portion represent a plurality of most significant bits of that data value, and the respective least-significant data portion represents the remaining least significant bits of that data value.

36. Image data decoding apparatus comprising:
 a frequency transformed configured to frequency-transform input frequency-transformed image data to generate array of output image data by a matrix-multiplication process, according to a maximum dynamic range of the transformed data and using transform matrices having a data precision; and
 a selector configured to select the maximum dynamic range and the data precision of the transform matrices according to the bit depth of the output image data.

37. Video data capture, transmission, display and/or storage apparatus comprising apparatus according to any one of clauses 33 to 36.

Further embodiments are defined by the following numbered clauses:

1. Data encoding apparatus for encoding input data values of a data set for encoding, the apparatus comprising:
 a selector configured to select one of a plurality of complementary sub-ranges of a set of code values according to the value of a current input data value, the set of code values being defined by a range variable and to assign the current input data value to a code value within the selected sub-range;
 a modifier configured to modify the set of code values in dependence upon the assigned code value and the size of the selected sub range;
 a detector configured to detect whether the range variable defining the set of code values is less than a predetermined minimum size and if so, to successively increase the range variable so as to increase the size of the set of code values until it has at least the predetermined minimum size; and outputting an encoded data bit in response to each such size-increasing operation; and
 a range variable setter configured, after encoding a group of input data values, to set the range variable to a value selected from a predetermined subset of available range variable values, each value in the subset having at least one least significant bit equal to zero.

2. Apparatus according to clause 1, in which the subset of available range variable values consists of the value 256.

3. Apparatus according to clause 1 or clause 2, in which:
 the proportions of the sub-ranges relative to the set of code values, are defined by a context variable associated with the input data value.

4. Apparatus according to clause 3, comprising the step of:
 following the coding of an input data value, modifying the context variable, for use in respect of a next input data value, so as to increase the proportion of the set of code values in the sub-range that was selected for the current input data value.

5. Apparatus according to any one of the preceding clauses, in which:
 the set of code values comprises values from 0 to an upper value defined by the range variable, the upper value being between the predetermined minimum size and a second predetermined values.

6. Apparatus according to clause 5, in which the predetermined minimum size is 256 and the second predetermined value is 510.

7. Apparatus according to any one of the preceding clauses, in which;
 the subset of available values of the range variable comprises the predetermined minimum size.

8. Apparatus according to clause 1, in which the subset comprises two or more values between the predetermined minimum size and the second predetermined value.

9. Apparatus according to clause 8, in which the range variable setter is configured to select a value from the subset according to a current value of the range variable.

10. Apparatus according to clause 9, in which the range variable setter is configured to select a particular value from the subset if the current value of the range variable is between that particular value and one less than a next-higher value in the subset.

11. Apparatus according to any one of the preceding clauses, comprising:
 a bypass data encoder configured to encode data representing coefficients which are not represented a data set as bypass data; and
 a bypass data quantity detector configured to detect the quantity of bypass data associated with a current array; and in which:
 the range variable setter is configured to set the range variable if the quantity of bypass data exceeds a threshold amount, but not to set the range variable otherwise.

12. Apparatus according to any one of the preceding clauses, in which:
 the input data values represent image data; and
 the image data are encoded as transform units comprising plurality of arrays of coefficients;
 in which the range variable setter is configured to set the range variable at the end of encoding a transform unit.

13. A method of data encoding input data values of a data set for encoding, the method comprising the steps of:
 selecting one of a plurality of complementary sub-ranges of a set of code values according to the value of a current input data value, the set of code values being defined by a range variable;
 assigning the current input data value to a code value within the selected sub-range;
 modifying the set of code values in dependence upon the assigned code value and the size of the selected sub-range;
 detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and
 after encoding a group of input data values, setting the range variable to a value selected from a predetermined subset of available range variable values, each value in the subset having at least one least significant bit equal to zero.

14. A method according to clause 13, in which the subset of available range variable values consists of the value 256.

15. A method according to clause 13 or clause 14, in which:
the proportions of the sub-ranges relative to the set of code values are defined by a context variable associated with the input data value.

16. A method according to clause 15, comprising the step of:
following the coding of an input data value, modifying the context variable, for use in respect of a next input data value, so as to increase the proportion of the set of code values in the sub-range that was selected for the current input data value.

17. A method according to any one of clauses 13 to 16, in which:
the set of code values comprises values from 0 to an upper value defined by the range variable, the upper value being between the predetermined minimum size and a second predetermined values.

18. A method according to clause 17, in which the predetermined minimum size is 256 and the second predetermined value is 510.

19. A method according to any one of clauses 13 to 18, in which:
the subset of available values of the range variable comprises the predetermined minimum size.

20. A method according to clause 13, in which the subset comprises two or more values between the predetermined minimum size and the second predetermined value.

21. A method according to clause 20, in which the setting step comprises selecting a value from the subset according to a current value of the range variable.

22. A method according to clause 21, in which the setting step comprises selecting a particular value from the subset if the current value of the range variable is between that particular value and one less than a next-higher value in the subset.

23. A method according to any one of clauses 13 to 22, comprising:
encoding data representing coefficients which are not represented a data set as bypass data;
detecting the quantity of bypass data associated with a current array; and
applying the setting step if the quantity of bypass data exceeds a threshold amount, but not applying the setting step otherwise.

24. A method according to any one of clauses 13 to 23, in which:
the input data values represent image data;
the image data are encoded as transform units comprising a plurality of arrays of coefficients, the method comprising applying the setting step at the end of encoding a transform unit.

25. Data encoded by the encoding method of any one of clauses 13 to 24.

26. A data carrier storing video data according to clause 25.

27. An instance of distribution of data according to clause 25.

28. Video data capture, transmission and/or storage apparatus comprising apparatus according to any one of clauses 1 to 12.

29. Data decoding apparatus for decoding a sequence of arithmetic-encoded data values, the apparatus comprising:
a selector configured to select one of a plurality of complementary sub-ranges of a set of code values, the set of code values being defined by a range variable;
a modifier configured to modify the set of code values in dependence upon the size of the selected sub-range;
a detector configured to detect an encoded data value and, in response to the detection, to increase the size of the set of code values, and to detect a termination of the sequence at which the range variable is set to a value selected from a predetermined subset of available range variable values, each value in the subset having at least one least significant bit equal to zero; and
a range variable setter configured, in response to the detection, to set the range variable and the size of the set of code values to the selected value.

30. Apparatus according to clause 29, in which the subset of available range variable values consists of the value 258.

31. Apparatus according to clause 29 or clause 30, comprising:
a detector configured to detect, from a final encoded data value at a termination of the sequence, one or more equiprobably encoded data values.

32. A method of decoding a sequence of arithmetic-encoded data values, the method comprising the steps of:
selecting one of a plurality of complementary sub-ranges of a set of code values, the set of code values being defined by a range variable;
modifying the set of code values in dependence upon the size of the selected sub-range;
detecting an encoded data value and, in response to the detection, to increase the size of the set of code values;
detecting a termination of the sequence at which the range variable is set to a value selected from a predetermined subset of available range variable values, each value in the subset having at least one least significant bit equal to zero; and
in response to the detecting step, setting the range variable and the size of the set of code values to the selected value.

33. A method according to clause 32, in, which the subset of available range variable values consists of the value 256.

34. A method according to clause 32 or clause 33, comprising:
detecting, from a final encoded data value at a termination of the sequence, one or more equiprobably encoded data values.

35. Computer software which, when executed by a computer, causes the computer to carry out the method of any one of clauses 13 to 24 and 32 to 34.

36. A non-transitory machine-readable storage medium which stores software according to clause 35.

37. Video data capture, transmission and/or storage apparatus comprising apparatus according to any one of clauses 29 to 31.

Further respective features are defined by the following numbered clauses:

1. Data encoding apparatus for encoding input data values of a data set for encoding, the apparatus comprising:
a selector configured to select one of a plurality of complementary sub-ranges of a set of code values according to the value of a current input data value, the set of code values being defined by a range variable and to assign the current input data value to a code value within the selected sub-range;
a modifier configured to modify the set of code values in dependence upon the assigned code value and the size of the selected sub-range;
a detector configured to detect whether the range variable defining the set of code values is less than a predetermined minimum size and if so, to successively increase the range variable so as to increase the size of the set of code values until it has at least the predetermined minimum size; and
outputting an encoded data bit in response to each such size-increasing operation; and a range variable setter configured, after encoding a group of input data values, to set the range variable to the predetermined minimum size.

2. Apparatus according to clause 1, in which the predetermined minimum size is 256.

3. Data encoding apparatus for encoding input data values of a data set for encoding, the apparatus comprising:

a selector configured to select one of a plurality of complementary sub-ranges of a set of code values according to the value of a current input data value, the set of code values being defined by a range variable and to assign the current input data value to a code value within the selected sub range;

a modifier configured to modify the set of code values in dependence upon the assigned code value and the size of the selected sub-range;

a detector configured to detect whether the range variable defining the set of code values is less than a predetermined minimum size and if so, to successively increase the range variable so as to increase the size of the set of code values until it has at least the predetermined minimum size; and outputting an encoded data bit in response to each such size-increasing operation; and to a range variable setter configured, after encoding a group of input data values, to set the range variable to 256.

4. A data decoding apparatus configured to decode data bits from a data stream encoded using binary arithmetic coding in which data bits are encoded as one of a plurality of complementary sub-ranges of a set of code values, the set of code values being defined by a range variable, the apparatus comprising:

a range variable setter configured, after decoding a group of data bits, to set the range variable to a predetermined value; and a data output configured to treat one or more subsequent data bits of the data stream as decoded data bits.

5. Apparatus according to clause 4, in which the predetermined value is 256.

6. A method of data encoding input data values of a data set for encoding, the method comprising the steps of:

selecting one of a plurality of complementary sub-ranges of a set of code values according to the value of a current input data value, the set of code values being defined by a range variable;

assigning the current input data value to a code value within the selected sub-range;

modifying the set of code values in dependence upon the assigned code value and the size of the selected sub-range;

detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and after encoding a group of input data values, setting the range variable to the predetermined minimum size.

7. A method according to clause 6, in which the predetermined minimum size is 256.

8. A method of data encoding input data values of a data set for encoding, the method comprising the steps of:

selecting one of a plurality of complementary sub-ranges of a set of code values according to the value of a current input data value, the set of code values being defined by a range variable;

assigning the current input data value to a code value within the selected sub-range;

modifying the set of code values in dependence upon the assigned code value and the size of the selected sub-range;

detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and after encoding a group of input data values, setting the range variable to 256.

9. A method of encoding and decoding data values using binary arithmetic coding in which one of a plurality of complementary sub-ranges of a set of code values is selected according to the value of a current input data value, the set of code values being defined by a range variable, the method comprising, after encoding or decoding a group of input data values, setting the range variable to a predetermined value.

10. A method according to clause 9, in which the predetermined value is 256.

11. A method according to clause 9 or clause 10, in which the predetermined value is a minimum allowable value of the range variable.

12. A method of data decoding data bits from a data stream encoded using binary arithmetic coding in which data bits are encoded as one of a plurality of complementary sub-ranges of a set of code values, the set of code values being defined by a range variable, the method comprising:

after decoding a group of data bits, setting the range variable to a predetermined value; and treating one or more subsequent data bits of the data stream as decoded data bits.

13. A method according to clause 12, in which the predetermined value is 256.

14. Encoding and decoding apparatus configured to perform the method of any one of clauses 9 to 11.

15. Computer software which, when executed by a computer, causes the computer to carry out the method of any one of clauses 6 to 13.

16. A non-transitory machine-readable storage medium by which software according to clause 15 is stored.

It will be appreciated that features defined in the various sets of clauses may be combined with features defined in others of the sets of clauses unless prohibited by the technical context.

As discussed earlier, it will be appreciated that apparatus features of the above clause may be implemented by respective features of the encoder or decoder as discussed earlier.

The invention claimed is:

1. A method of decoding a sequence of data values comprising Context-Based Adaptive Binary Arithmetic Coding (CABAC) encoded data values and CABAC bypass data values, comprising:

prior to decoding CABAC bypass data values in the sequence of data values, setting a range variable value of a CABAC decoder to a predetermined value, which has at least one significant bit equal to zero, and treating a portion of the sequence of data values as a shift register and outputting CABAC bypass data values as sequential bit values to a decoded data stream.

2. The method according to claim 1, wherein the predetermined value is a largest valid power of two value, which creates a sub-range for n-bit CABAC entropy decoding.

3. The method according to claim 1, wherein the predetermined value is 256.

4. The method according to claim 1, further comprising simultaneously decoding CABAC encoded data values and outputting CABAC bypass data values to form the decoded data stream.

5. The method according to claim 1, wherein a state of the CABAC decoder is aligned to a bit boundary of the CABAC bypass data values of the sequence of data values.

6. The method according to claim 5, wherein the state of the CABAC decoder includes a range variable value and an m_value.

7. The method according claim 5, further comprising selectively treating the sequence of data values as bit-aligned.

8. The method according to claim 1, wherein the sequence of data values comprises
transform coefficients.

9. The method according to claim 1, wherein the sequence of data values comprises HEVC video data.

10. A non-transitory computer readable medium including computer program instructions, which when executed by a computer causes the computer to implement the method of claim 1.

11. A data decoding apparatus configured to decode a sequence of data values comprising Context-Based Adaptive Binary Arithmetic Coding (CABAC) encoded data values and CABAC bypass data values, comprising:
a processor configured to:
prior to decoding CABAC bypass data values in the sequence of data values, set a range variable value of a CABAC decoder to 256, and
treat a portion of the sequence data values as a shift register and output CABAC bypass data values as sequential bit values to a decoded data stream.

12. The data decoding apparatus as claimed in claim 11, further comprising: a memory wherein the decoded data stream is stored in the memory.

13. The data decoding apparatus as claimed in claim 11, wherein the processor is further configured to simultaneously decode CABAC encoded data values and output CABAC bypass data values to form the decoded data stream.

14. The data decoding apparatus as claimed in claim 11, wherein state values of the CABAC decoder are aligned to a bit boundary of the sequence of data values.

15. The data decoding apparatus as claimed in claim 14, wherein the state values include a range variable value and m_value.

16. The data decoding apparatus as claimed in claim 14, wherein the processor is further configured to selectively treat the sequence of data values as bit-aligned.

17. The data decoding apparatus as claimed in claim 14, wherein the processor is further configured to selectively decode CABAC encoded data values and CABAC bypass data values in a non-bit aligned mode.

18. The data decoding apparatus as claimed in claim 11, wherein the sequence of data values comprises HEVC video data or transform coefficients.

19. A video receiver for receiving a signal, the receiver comprising:
the data decoding apparatus of claim 11.

20. A video capture apparatus comprising:
an image sensor;
a video encoder; and
the data decoding apparatus according to claim 11.

* * * * *